US012284902B2

(12) United States Patent
Sun et al.

(10) Patent No.: US 12,284,902 B2
(45) Date of Patent: Apr. 22, 2025

(54) DISPLAY SUBSTRATE AND PREPARATION METHOD THEREFOR, AND DISPLAY DEVICE

(71) Applicant: BOE Technology Group Co., Ltd., Beijing (CN)

(72) Inventors: Zhongyuan Sun, Beijing (CN); Meng Yan, Beijing (CN); Che An, Beijing (CN); Guangcai Yuan, Beijing (CN); Jinnv Liu, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 449 days.

(21) Appl. No.: 17/771,015

(22) PCT Filed: Jun. 10, 2021

(86) PCT No.: PCT/CN2021/099444
§ 371 (c)(1),
(2) Date: Apr. 22, 2022

(87) PCT Pub. No.: WO2022/017051
PCT Pub. Date: Jan. 27, 2022

(65) Prior Publication Data
US 2022/0384747 A1 Dec. 1, 2022

(30) Foreign Application Priority Data
Jul. 24, 2020 (CN) .......................... 202010727526.5

(51) Int. Cl.
*H10K 77/10* (2023.01)
*H10K 50/84* (2023.01)
(Continued)

(52) U.S. Cl.
CPC ........... *H10K 77/111* (2023.02); *H10K 50/84* (2023.02); *H10K 50/858* (2023.02);
(Continued)

(58) Field of Classification Search
CPC .... H10K 77/111; H10K 50/84; H10K 50/858; H10K 50/865; H10K 59/38; H10K 71/00;
(Continued)

(56) References Cited

U.S. PATENT DOCUMENTS

| 2012/0307191 A1 | 12/2012 | Park et al. |
| 2013/0134438 A1 | 5/2013 | Ray et al. |

(Continued)

FOREIGN PATENT DOCUMENTS

| CN | 102809846 A | 12/2012 |
| CN | 106199899 A | 12/2016 |

(Continued)

OTHER PUBLICATIONS

English Machine Translation of Wang et al CN 108598125 (Year: 2024).*

(Continued)

*Primary Examiner* — Donald L Raleigh
(74) *Attorney, Agent, or Firm* — Ling Wu; Stephen Yang; Ling and Yang Intellectual Property

(57) ABSTRACT

A display substrate (910), including a flexible substrate body, a thickness adjustment layer (71), and a micro-lens layer (72). The flexible substrate body includes: a plurality of island-shaped display regions (100) spaced apart from each other, a hollow region (300) disposed between adjacent island-shaped display regions (100), and a connection region (200) for connecting the adjacent island-shaped display regions (100). The thickness adjustment layer (71) is disposed on light exit sides of the plurality of island-shaped display regions (100) of the flexible substrate body. The micro-lens layer (72) is disposed on the side of the thickness adjustment layer (71) away from the flexible substrate body.

18 Claims, 14 Drawing Sheets

(51) Int. Cl.
  *H10K 50/858* (2023.01)
  *H10K 50/86* (2023.01)
  *H10K 59/38* (2023.01)
  *H10K 71/00* (2023.01)

(52) U.S. Cl.
  CPC ........... *H10K 50/865* (2023.02); *H10K 59/38* (2023.02); *H10K 71/00* (2023.02)

(58) Field of Classification Search
  CPC .. H10K 59/873; H10K 59/8792; H10K 59/87; H10K 59/879; H10K 2102/351; H10K 59/131; Y02E 10/549
  See application file for complete search history.

(56) References Cited

U.S. PATENT DOCUMENTS

| | | |
|---|---|---|
| 2016/0240802 A1 | 8/2016 | Lee |
| 2017/0125719 A1 | 5/2017 | Noh |
| 2017/0279057 A1 | 9/2017 | Park et al. |
| 2021/0193763 A1 | 6/2021 | Sun et al. |
| 2021/0217995 A1* | 7/2021 | Wang ................... H10K 50/865 |
| 2022/0037621 A1 | 2/2022 | Xue et al. |

FOREIGN PATENT DOCUMENTS

| | | | |
|---|---|---|---|
| CN | 107221550 A | | 9/2017 |
| CN | 108598125 A | * 9/2018 | ............. G09F 9/301 |
| CN | 110416266 A | | 11/2019 |
| CN | 110851028 A | | 2/2020 |
| CN | 111223904 A | | 6/2020 |
| CN | 111370592 A | | 7/2020 |
| TW | 201640708 A | | 11/2016 |

OTHER PUBLICATIONS

International Search Report for PCT/CN2021/099444 Mailed Sep. 1, 2021.
Office Action dated May 18, 2022 for Chinese Patent Application No. 202010727526.5 and English Translation.
Office Action dated Sep. 26, 2022 for Chinese Patent Application No. 202010727526.5 and English Translation.

* cited by examiner (a)　　　(b)

DISPLAY SUBSTRATE AND PREPARATION METHOD THEREFOR, AND DISPLAY DEVICE

CROSS-REFERENCE TO RELATED APPLICATIONS

The present application is a U.S. National Phase Entry of International Application No. PCT/CN2021/099444 having an international filing date of Jun. 10, 2021, which claims priority to Chinese Patent Application No. 202010727526.5 entitled "Display Substrate and Preparation Method Therefor, and Display Device" and filed on Jul. 24, 2020. The above-identified applications are hereby incorporated by reference.

TECHNICAL FIELD

The present disclosure relates to, but is not limited to, the field of display technology, and more particularly, to a display substrate, a manufacturing method thereof, and a display device.

BACKGROUND

Organic light-emitting Diode (OLED) is an active light-emitting display device, which has the advantages of self-illumination, ultra-thinness, fast response speed, wide viewing angle and low power consumption. With the continuous development of OLED display technology, display products using OLED display technology have gradually developed from the current curved product form to foldable or even stretchable product form. In the current stretchable OLED display solution, the display product includes rigid display regions and an elastic wire region connected to the rigid display regions. The rigid display regions do not bear stretching deformation, and the elastic wire region connected to the rigid display regions can bear certain deformation, thus achieving the stretching of the entire display product.

SUMMARY

The following is a summary of subject matters described herein in detail. The summary is not intended to limit the scope of protection of claims.

The present disclosure provides a display substrate and a preparation method thereof, and a display apparatus.

In one aspect, the present disclosure provides a display substrate including a flexible substrate body, a thickness adjusting layer, and a micro-lens layer. The flexible substrate body includes: a plurality of island-shaped display regions spaced apart from each other, a hollow region disposed between adjacent island-shaped display regions and a connection region for connecting the adjacent island-shaped display regions. The thickness adjusting layer is disposed on light exit sides of the plurality of island-shaped display regions of the flexible substrate body. The micro-lens layer is disposed on a side of the thickness adjusting layer away from the flexible substrate body. The orthographic projection of the thickness adjusting layer on the flexible substrate body includes the orthographic projection of the micro-lens layer on the flexible substrate body, and the orthographic projection of the micro-lens layer on the flexible substrate body at least partially overlaps the plurality of island-shaped display regions. The thickness adjusting layer and the micro-lens layer are configured to enlarge an image displayed by the plurality of island-shaped display regions.

In another aspect, the present disclosure provides a display device, including the display substrate described above.

In another aspect, the present disclosure provides a method for preparing a display substrate, including: preparing a flexible substrate body, wherein the flexible substrate body includes a plurality of island-shaped display regions spaced apart from each other, a hollow region disposed between adjacent island-shaped display regions and a connection region for connecting the adjacent island-shaped display regions; forming a thickness adjusting layer on the light exit side of the plurality of island-shaped display regions of the flexible substrate body; and forming a micro-lens layer on a side of the thickness adjusting layer away from the flexible substrate body. The orthographic projection of the thickness adjusting layer on the flexible substrate body includes the orthographic projection of the micro-lens layer on the flexible substrate body, and the orthographic projection of the micro-lens layer on the flexible substrate body at least partially overlaps the plurality of island-shaped display regions. The thickness adjusting layer and the micro-lens layer are configured to enlarge an image displayed by the plurality of island-shaped display regions.

Other aspects may be understood upon reading and understanding of the accompanying drawings and detailed descriptions.

BRIEF DESCRIPTION OF DRAWINGS

Accompanying drawings are used to provide an understanding of technical solutions of the present disclosure, form a part of the specification, and are used to explain the technical solutions of the present disclosure together with the embodiments of the present disclosure and not intended to form limitations on the technical solutions of the present disclosure.

DETAILED DESCRIPTION

Figure 1:
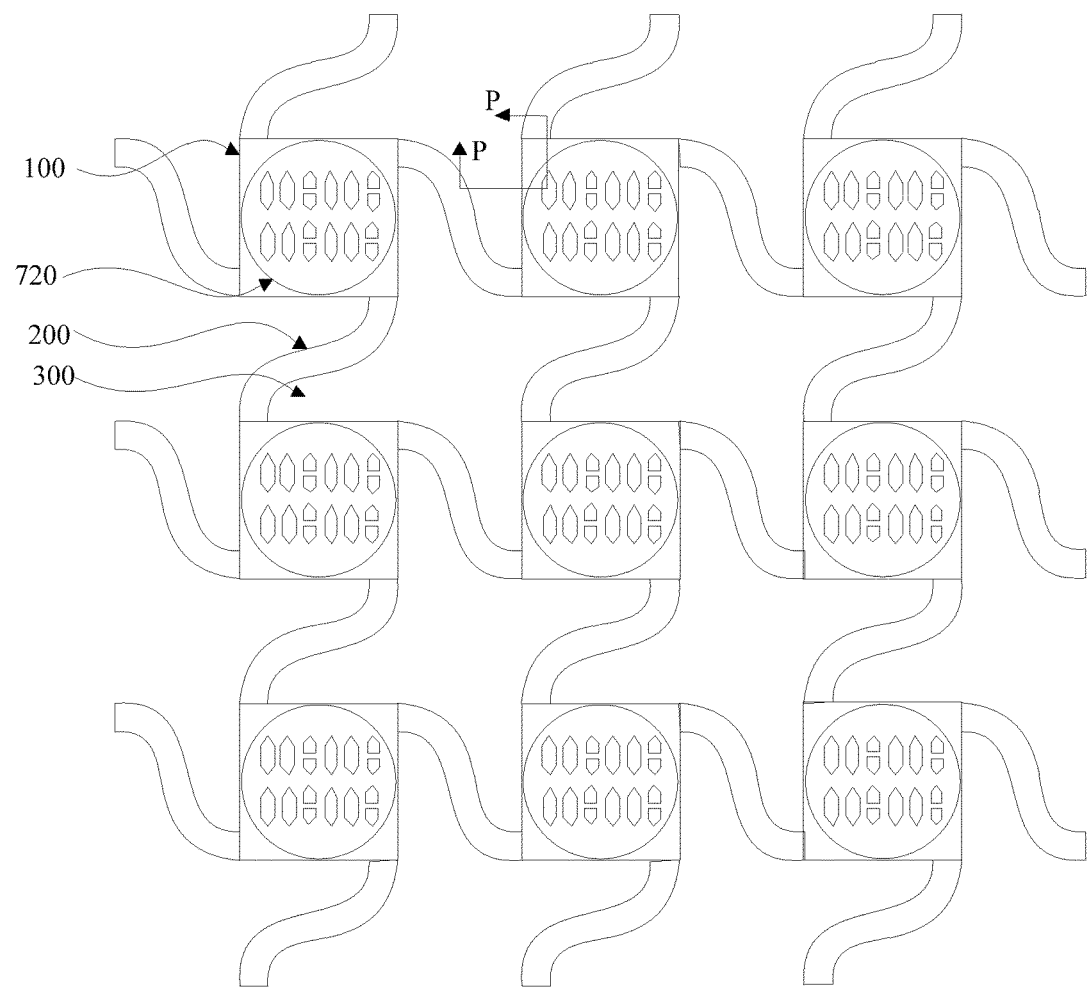
FIG. 1 is a schematic diagram of a structure of a display substrate according to at least one embodiment of the present disclosure.

A plurality of embodiments are described in the present disclosure. However, the description is exemplary and unrestrictive. Moreover, it is apparent to those of ordinary skills in the art that there may be more embodiments and implementation solutions in the scope of the embodiments described in the present disclosure. Although many possible feature combinations are shown in the drawings and discussed in the implementation modes, disclosed features may be combined in many other manners. Unless expressly limited, any feature or element of any embodiment may be used in combination with, or may be used to replace, any other feature or element in any other embodiment.

The present disclosure includes and contemplates combinations of features and elements known to those of ordinary skill in the art. The embodiments, features, and elements disclosed in the present disclosure may be combined with any conventional feature or element to form a unique solution defined by the claims. Any feature or element of any embodiment may be combined with a feature or an element from another solution to form another unique solution defined by the claims. Therefore, it should be understood that any feature shown or discussed in the present disclosure may be implemented independently or in any appropriate combination. Therefore, the embodiments are not to be limited except the limitation by the appended claims and their equivalents. In addition, one or more modifications and alterations may be made within the protection scope of the appended claims.

In addition, when a representative embodiment is described, a method or a process may already be presented as a specific order of steps in the specification. However, the method or the process should not be limited to the steps with the specific order on the premise that the method or the process is independent of the specific order of the steps described herein. Those of ordinary skills in the art will understand that other orders of step may also be possible. Therefore, the specific order of the steps illustrated in the specification should not be interpreted as a limitation on claims. In addition, the claims with respect to the method or process should not be limited to execute their steps according to the written sequence. Those skilled in the art may easily understand that these sequences may change, and are still maintained in the spirit and scope of the embodiments of the disclosure.

In the accompanying drawings, the size of a constituent element, and the thickness of a layer or an area are sometimes exaggerated for clarity. Therefore, an implementation of the present disclosure is not necessarily limited to the size shown, and a shape and size of each component in the drawings do not reflect true proportions. In addition, the accompanying drawings schematically show ideal examples, and one mode of the present disclosure is not limited to a shape, a numerical value, or the like shown in the accompanying drawings.

Unless otherwise defined, technical terms or scientific terms used in the present disclosure have the same meanings as commonly understood by those of ordinary skills in the art to which the present disclosure belongs. The "first," "second," and similar terms used in the present disclosure do not indicate any order, number, or importance, but are used only for distinguishing different components. In the present disclosure, "a plurality of" may refer to two or more than two. The word "include" or "contain", etc. means that an element or article that precedes the word is inclusive of the element or article listed after the word and equivalents thereof, but does not exclude other elements or articles. Similar terms such as "couple", "connect" or "link" are not limited to physical or mechanical connections, but may include electrical connections, whether direct or indirect. "Electrical connection" includes a case where constituent elements are connected together through an element with certain electrical effects. There is no specific restriction on the "element having a certain electrical function" as long as it may transmit and receive electrical signals between connected constituent elements. Examples of "the element with the certain electrical effect" not only include an electrode and wiring, but also a switching element such as a transistor, a resistor, an inductors, a capacitor, and another element with one or more functions.

In the present disclosure, a transistor refers to an element including at least three terminals, namely, a gate electrode, a drain electrode and a source electrode. The transistor has a channel region between the drain electrode (drain electrode terminal, drain region, or drain electrode) and the source electrode (source electrode terminal, source region, or source electrode), and a current may flow through the drain electrode, the channel region and the source electrode. In the present disclosure, the channel region refers to a region through which the current mainly flows.

In the present disclosure, a first electrode is a drain electrode, and a second electrode is a source electrode. Alternatively, a first electrode is a source electrode, and a second electrode is a drain electrode. In the case that transistors with opposite polarities are used, or that a direction of a current changes during operation of a circuit, or the like, functions of the "source electrode" and the "drain electrode" are sometimes exchanged. Therefore, the "source electrode" and the "drain electrode" are interchangeable in the present disclosure.

In the present disclosure, "parallel" refers to a state in which an angle formed by two straight lines is above −10 degrees and below 10 degrees, and thus may include a state in which the angle is above −5 degrees and below 5 degrees. In addition, "perpendicular" refers to a state in which an angle formed by two straight lines is above 80 degrees and below 100 degrees, and thus may include a state in which the angle is above 85 degrees and below 95 degrees.

In the present disclosure, "film" and "layer" are interchangeable. For example, sometimes a "conducting layer" may be replaced with a "conducting film". Similarly, sometimes an "insulating film" may be replaced with an "insulating layer".

In the present disclosure, "about" refers to that a boundary is defined not so strictly and numerical values in process and measurement error ranges are allowed.

In the present disclosure, "stretchable" refers to the ability of a material, structure, device, or device assembly to withstand tensile deformation (e.g., lengthening, or widening, or lengthening and widening) without permanent deformation or failure such as rupture, for example, the ability to be stretched at least 10% of its length without permanent deformation, cracking, or breaking. "Stretchable" is also intended to include a substrate constructed with the following mode and having components (whether or not the components themselves can be individually stretched as described above): may accommodate stretchable, expandable, or deployable surfaces and may still retain functionality when applied to stretchable, expandable, or deployable surfaces that have been stretched, expanded, or deployed. "Stretchable" is also intended to include a substrate that may be elastically or plastically deformed (i.e., after being stretched, the substrate may be changed back to its original size when the tensile force is released, or the substrate cannot be changed back to its original size and in some examples may remain in a stretched form), and deformation (e.g. stretching and optionally bending) may occur during manufacture of the substrate, during assembly (which may be considered as part of the manufacturing operation) of the device having the substrate, or during use (e.g. the user is able to stretch and optionally bend the substrate).

In order to keep the following description of the embodiments of the present disclosure clear and concise, detailed descriptions about part of known functions and known components are omitted in the present disclosure. The drawings of the embodiments of the present disclosure only involve the structures involved in the embodiments of the present disclosure, and other structures may refer to conventional designs.

A flexible display substrate, including: a flexible substrate, wherein the flexible substrate is provided with a plurality of island-shaped display regions spaced apart from each other, a hollow region disposed between adjacent island-shaped display regions and a flexible connection unit for connecting the adjacent island-shaped display regions. The flexible substrate under the island-shaped display region and the flexible connection unit is retained, and the flexible substrate in the hollow region is removed. The island-shaped display region is provided with a plurality of light-emitting units. In the flexible display substrate, only the island-shaped display regions can display images, while the hollow region and the flexible connecting unit cannot display images. Therefore, the picture effect displayed by the flexible display substrate is island-shaped spliced images, and there are splicing seams in the hollow region and the flexible connecting unit, which will affect the display effect.

At least one embodiment of the present disclosure provides a display substrate, including a flexible substrate body, a thickness adjusting layer and a micro-lens layer. The flexible substrate body includes: a plurality of island-shaped display regions spaced apart from each other, a hollow region disposed between adjacent island-shaped display regions and a connection region for connecting the adjacent island-shaped display regions. The thickness adjusting layer is disposed on light exit sides of the plurality of island-shaped display regions of the flexible substrate body. The micro-lens layer is disposed on a side of the thickness adjusting layer away from the flexible substrate body. The orthographic projection of the thickness adjusting layer on the flexible substrate body includes the orthographic projection of the micro-lens layer on the flexible substrate body, and the orthographic projection of the micro-lens layer on the flexible substrate body is at least partially overlapped with the plurality of island-shaped display regions. The thickness adjusting layer and the micro-lens layer are configured to enlarge an image displayed by the plurality of island-shaped display regions.

By arranging the thickness adjusting layer and the micro-lens layer, the image displayed in a plurality of island-shaped display regions is enlarged according to a certain proportion after passing through the thickness adjusting layer and the micro-lens layer. In this way, there is no splicing seam on the displayed image observed by human eyes, and the influence of splicing seam on the display image is greatly weakened, thereby optimizing the display effect.

In some exemplary embodiments, the micro-lens layer includes a plurality of micro-lenses. In some examples, the types of the plurality of micro-lenses may include at least one of a plano-convex lens and a lenticular lens. For example, a plurality of micro-lenses of the micro-lens layer are all plano-convex lenses, or a plurality of micro-lenses of the micro-lens layer are all lenticular lenses, or a part of the micro-lenses of the micro-lens layer are plano-convex lenses and another part of the micro-lenses are lenticular lenses. However, this embodiment is not limited thereto.

In some examples, the magnification times of the image displayed by an island-shaped display region may be determined according to the focal length of the micro-lens corresponding to the island-shaped display region. For example, according to the principle of forming virtual image with convex lens, the magnification times may be between L/f and 1+L/f, where L denotes the distance between human eyes and the display substrate, and f denotes the focal length of micro-lens. Taking the cell phone product including a display substrate of the present embodiment as an example, when the types and parameters of a plurality of micro-lenses of the micro-lens layer are all the same, and the distance at which the human eye observes the cell phone product is a minimum visible distance of 25 cm, the magnification times of the displayed image is between 25/f and 1+25/f, and f is the focal length of the micro-lens of the micro-lens layer.

In some examples, the focal length of a plano-convex lens may be determined according to the following equation:

$$f_{convex\ lens} = \frac{r}{(n-1)} > 0;$$

wherein, r denotes the spherical radius of the plano-convex lens and n denotes the refractive index of the lens. For example, if n=1/5, then $f_{convex\ lens}=2r$, that is, the larger the radius of the sphere, the larger the focal length of the lens.

In some examples, the focal length of a lenticular lens may be determined according to the following equation:

$$f_{lenticular\ lens} = \frac{r_1 r_2}{(n-1)(r_1 + r_2)} > 0;$$

wherein, R1 denotes the first spherical radius of the lenticular lens, R2 denotes the second spherical radius of the lenticular lens, and n denotes the refractive index of the lens.

In some exemplary embodiments, the orthographic projection of at least one of a plurality of micro-lenses on a flexible substrate body at least partially overlaps one of the plurality of island-shaped display regions. In other words, any one of the plurality of island-shaped display regions at least partially overlaps the orthographic projection of the at least one micro-lens on the flexible substrate body. That is, there is a one-to-one or multi-to-one correspondence between the micro-lens and the island-shaped display region. In some examples, the orthographic projection of any one of a plurality of micro-lenses on a flexible substrate body at least partially overlaps one of a plurality of island-shaped display regions, and the orthographic projections of different micro-lenses on the flexible substrate body at least partially overlap different island-shaped display regions respectively. That is, a plurality of micro-lenses and a plurality of island-shaped display regions correspond one to one. Alternatively, in some examples, the orthographic projections of at least two adjacent micro-lenses of a plurality of micro-lenses on the flexible substrate body at least partially overlap respectively the same island-shaped display region of the plurality of island-shaped display regions. That is, at least two micro-lenses correspond to an island-shaped display region. Or, in some examples, a first quantity of micro-lenses corresponds to a first quantity of island-shaped display regions one by one, and a second quantity of micro-lenses corresponds to a third quantity of island-shaped display regions in a multi-to-one relationship. The sum of the first quantity and the second quantity is the total quantity of micro-lenses, and the sum of the first quantity and the third quantity is the total quantity of island-shaped display regions. However, this embodiment is not limited thereto.

In some examples, the orthographic projection of any one of the plurality of micro-lenses on the flexible substrate body is located within one island-shaped display region, and the orthographic projections of different micro-lenses on the flexible substrate body overlap different island-shaped display regions respectively. That is, a plurality of micro-lenses correspond to a plurality of island-shaped display regions one by one, and the orthographic projection of each micro-lens on the flexible substrate body is located in the corresponding island-shaped display region. However, this embodiment is not limited thereto. For example, a plurality of micro-lenses and a plurality of island-shaped display regions may correspond one to one, and the orthographic projection of each micro-lens on the flexible substrate body may partially overlap the corresponding island-shaped display region. For example, the orthographic projection of each micro-lens on the flexible substrate body may at least partially overlap respectively the corresponding island-shaped display region, at least one hollow region and at least one connection region around the island-shaped display region.

In some examples, orthographic projections of at least two adjacent micro-lenses of the plurality of micro-lenses on the flexible substrate body are located within the same island-shaped display region. That is, at least two micro-lenses correspond to an island-shaped display region, and the orthographic projections of at least two micro-lenses on the flexible substrate body are located in the corresponding island-shaped display region. However, this embodiment is not limited thereto. For example, the orthographic projections of at least two adjacent micro-lenses of the plurality of micro-lenses on the flexible substrate body may at least partially overlap respectively the same island-shaped display region, at least one hollow region and at least one connection region around the island-shaped display region.

In some exemplary embodiments, the orthographic projection of any one of a plurality of micro-lenses on the flexible substrate body at least partially overlaps at least two adjacent island-shaped display regions of a plurality of island-shaped display regions. In other words, the same micro-lens corresponds to at least two island-shaped display regions. For example, the orthographic projection of a micro-lens on the flexible substrate body at least partially overlap respectively with four adjacent island-shaped display regions, at least one hollow region and at least one connection region around the four adjacent island-shaped display regions.

In some examples, when the plurality of micro-lenses correspond to the plurality of island-shaped display regions one by one, the types of the plurality of micro-lenses of the micro-lens layer may be the same (e.g., be all plano-convex lenses or all lenticular lenses), or all different, or partially the same. The dimensions (e.g. spherical radii) of a plurality of micro-lenses of the same type may be different, or partially identical, or completely identical. However, this embodiment is not limited thereto.

In some examples, when at least two adjacent micro-lenses correspond to the same island-shaped display region, at least two micro-lenses corresponding to the same island-shaped display region may have the same type (e.g. both are plano-convex lenses or lenticular lenses) and same dimensions (e.g. spherical radius), and the types of micro-lenses corresponding to different island-shaped display regions may be the same or different. When the types of micro-lenses corresponding to different island-shaped display regions are the same, the dimensions (e.g. spherical radii) of at least two micro-lenses corresponding to the same island-shaped display region are the same, and the dimensions of micro-lenses corresponding to different island-shaped display regions may be the same or different. For example, a plurality of micro-lenses corresponding to one island-shaped display region are all plano-convex lenses and the spherical radii of the micro-lenses are all a first value, and a plurality of micro-lenses corresponding to another island-shaped display region are all plano-convex lenses and the spherical radii of the micro-lenses are all a second value, where the first value is different from the second value. However, this embodiment is not limited thereto.

In some examples, when any one of the plurality of micro-lenses corresponds to at least two adjacent island-shaped display regions, the types of the plurality of micro-lenses may be identical, or different, or partially identical. The dimensions (e.g. spherical radii) of a plurality of micro-lenses of the same type may be different, or partially identical, or completely identical. However, this embodiment is not limited thereto.

In some exemplary embodiments, the thickness adjusting layer may include a plurality of thickness adjusting regions in one-to-one correspondence to a plurality of micro-lenses. The orthographic projection of any thickness adjusting region on the flexible substrate body includes the orthographic projection of the corresponding micro-lens on the flexible substrate body. For any micro-lens of a micro-lens layer, the correlation between the micro-lens and the thickness of the corresponding thickness adjusting region is $1/f=1/h+1/L$, where f denotes the focal length of the micro-lens, h denotes the thickness of the thickness adjusting region, and L denotes the distance between the human eye and the display substrate.

In the present disclosure, "thickness" refers to a height from a surface close to the flexible substrate to a surface away from the flexible substrate in a direction perpendicular to a plane of the flexible substrate.

In some exemplary embodiments, the thickness adjusting layer may be made of a stretchable material such as polydimethylsiloxane (PDMS), Styrene Ethylene Butylene Styrene (SEBS), Ecoflex and other materials with high elasticity. In the present exemplary embodiment, the thickness adjusting layer is made of a stretchable material which ensures that the display image optimization may be achieved even with a certain amount of stretching.

In some exemplary embodiments, at least one island-shaped display region includes a flexible substrate, a display structure layer disposed on the flexible substrate, and a color filter layer disposed on the light exit side of the display structure layer. The display structure layer includes a plurality of light-emitting units. The color filter layer includes a black matrix and a plurality of filter units in one-to-one correspondence with a plurality of light-emitting units within a sub-pixel region defined by the black matrix.

In some exemplary embodiments, a display structure layer, a color filter layer, a thickness adjusting layer and a micro-lens layer are disposed on a same side of a flexible substrate; alternatively, the display structure layer is disposed on one side of the flexible substrate, and the color filter layer, the thickness adjusting layer and the micro-lens layer are disposed on the other side of the flexible substrate. In other words, the display substrate may have a top emission structure or a bottom emission structure. However, this embodiment is not limited thereto.

In some exemplary embodiments, the plurality of island-shaped display regions may further include a thin film encapsulation layer disposed on a side of the display structure layer away from the flexible substrate. By providing a thin film encapsulation layer, the light-emitting unit may be protected from water and oxygen erosion.

In some exemplary embodiments, the plurality of island-shaped display regions may further include a hard mask layer disposed on a side of the color filter layer away from the flexible substrate. By providing a hard mask layer, when etching the film structure of the hollow region, the non-hollow region (i.e., the island-shaped display region and the connection region) may be prevented from being damaged by the etching gas.

In some exemplary embodiments, the display substrate may further include a first adhesive layer and a first over coat layer sequentially disposed on a side of the micro-lens layer away from the flexible substrate body, and a second adhesive layer and a second over coat layer sequentially disposed on a side of the flexible substrate body away from the micro-lens layer. The top surface and the bottom surface of the display substrate may be protected by the first over coat layer and the second over coat layer.

FIG. 1 is a schematic diagram of a structure of a display substrate according to at least one embodiment of the present disclosure. The display substrate shown in FIG. 1 is, for example, in a stretched state. As shown in FIG. 1, on a plane parallel to the display substrate, the display substrate body of the present embodiment includes a plurality of island-shaped display regions 100 spaced apart from each other, a hollow region 300 disposed between adjacent island-shaped display regions 100 and a connection region 200 for connecting the adjacent island-shaped display regions 100. Each island-shaped display region 100 is configured to perform image display, each hollow region 300 is configured to provide deformation space when the display substrate is stretched, and each connection region 200 is configured to set signal lines and transmit tension force. Each island-shaped display region 100 may include one or more pixel units, and each pixel unit may include three light-emitting units emitting different colors (for example, light-emitting units of red, green and blue) or four light-emitting units emitting different colors (for example, light-emitting units of red, green, blue and white). Each light-emitting unit may include a light-emitting element and a drive circuit configured to drive the light-emitting element to emit light.

In some exemplary embodiments, as shown in FIG. 1, a plurality of connection regions 200 may connect a plurality of island-shaped display regions 100 to each other on a plane parallel to the display substrate. For example, each island-shaped display region 100 of the plurality of island-shaped display regions 100 may be rectangular, and each island-shaped display region 100 is connected to four connection regions 200, and the four connection regions 200 connected to one island-shaped display region 100 may extend in different directions to be respectively connected to four other island-shaped display regions 100 surrounding the island-shaped display region 100. However, this embodiment is not limited thereto. In some examples, each of the plurality of island-shaped display regions may be a regular polygon or other irregular shape. Alternatively, in some examples, the shapes of a plurality of island-shaped display regions may be different.

In some exemplary embodiments, on a plane parallel to the display substrate, with the display substrate in an unstretched state, the hollow region may be L-shaped, or a shape in which a plurality of L-shapes are connected, such as an I-shape, a T-shape, or the like. The width of the hollow region may be from 10 microns (μm) to 500 μm. The connection region may be L-shaped, or a plurality of L-shaped connected shapes, such as T-shaped, ⊔-shaped and so on. The width of the connection region may be 10 microns (μm) to 500 μm. However, this embodiment is not limited thereto.

In some exemplary embodiments, as shown in FIG. 1, a micro-lens layer may include a plurality of micro-lenses 720 on a direction parallel to the display substrate. An island-shaped display region 100 includes only the orthographic projection of one micro-lens 720 on the display substrate body. In other words, there is a one-to-one correspondence between the plurality of micro-lenses 720 and the plurality of island-shaped display regions 100. In some examples, as shown in FIG. 1, each island-shaped display region 100 may be square, the orthographic projection of each micro-lens 720 on the display substrate body may be circular, and the center of the orthographic projection of one micro-lens 720 on the display substrate body may coincide with the center of a corresponding island-shaped display region 100. For example, the orthographic projection of the micro-lens 720 corresponding to an island-shaped display region 100 on the display substrate body is an inscribed circle of the island-shaped display region 100. In some examples, the size range of any island-shaped display region may be 0.1 mm×0.1 mm to 1.5 mm×1.5 mm, and the diameter range of the micro-lens corresponding to the island-shaped display region may be 0.1 mm to 1.5 mm. However, this embodiment is not limited thereto. In some examples, the island-shaped display region may be rectangular, and the orthographic projection of the micro-lens corresponding to the island-shaped display region on the display substrate body may be elliptical within the island-shaped display region. Alternatively, in some examples, the orthographic projection of a micro-lens corresponding to an island-shaped display region on the display substrate body may partially overlap the island-shaped display region. For example, an island-shaped display region is square, and the orthographic projection of the micro-lens corresponding to the island-shaped display region on the display substrate body may be elliptical. The orthographic projection of the micro-lens corresponding to the island-shaped display region on the display substrate body may partially overlap respectively with the island-shaped display region, the hollow region and the connection region around the island-shaped display region.

Figure 2:
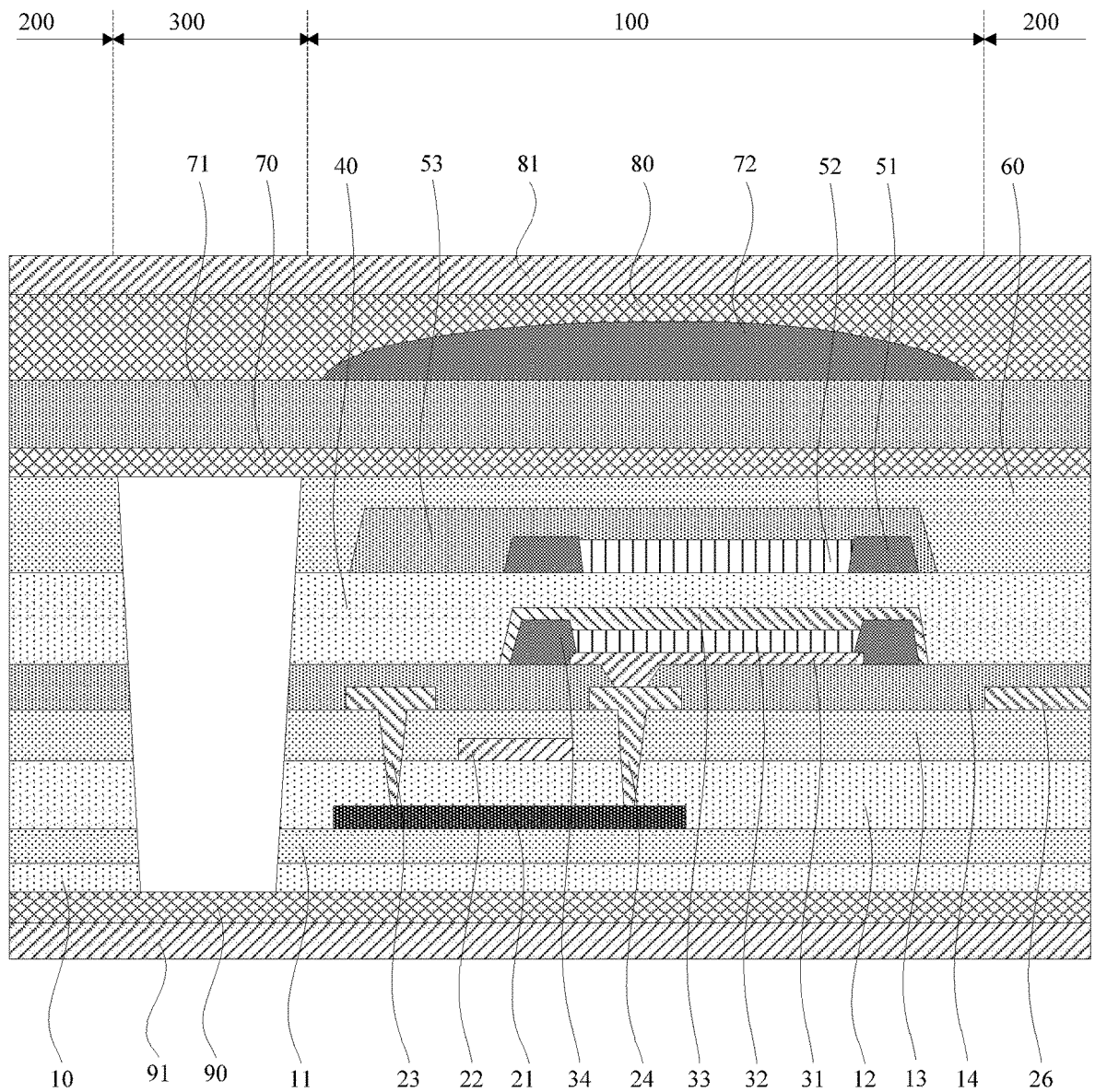
FIG. 2 is a schematic sectional view along a P-P direction in FIG. 1.

In some exemplary embodiments, as shown in FIG. 2, on a plane perpendicular to the display substrate, an island-shaped display region 100 may include: a flexible substrate 10, a display structure layer, a thin film encapsulation layer 40, a color filter layer, a hard mask layer 60, a third adhesive layer 70, a thickness adjusting layer 71, a micro-lens layer 72, a first adhesive layer 80 and a first over coat layer 81 sequentially disposed on the flexible substrate 10, and a second adhesive layer 90 and a second over coat layer 91 disposed on a side of the flexible substrate 10 away from the display structure layer. The display structure layer of the island-shaped display region 100 includes a drive structure layer and a light-emitting structure layer stacked on the flexible substrate 10. The drive structure layer includes a plurality of driving circuits. Each of the driving circuits includes a plurality of transistors or includes a plurality of transistors and at least one storage capacitor, for example, may be a 2T1C, 3T1C or 7T1C design. The light-emitting structure layer includes a plurality of light-emitting elements. A plurality of driving circuits are connected to a plurality of light-emitting elements in one-to-one correspondence. Each light-emitting element includes a first electrode (e.g. a reflective anode), an organic emitting layer, and a second electrode (e.g. a transparent cathode). The color filter layer includes a black matrix 51 provided on a thin film encapsulation layer 40, a plurality of filter units 52 located in a sub-pixel region defined by the black matrix 51 and in one-to-one correspondence with a plurality of light-emitting elements, and a filter over coat layer 53 covering the black matrix 51 and the plurality of filter units 52. In FIG. 2, only one transistor, one light-emitting element and one filter unit are illustrated as examples. The orthographic projection of the micro-lens layer 72 on the flexible substrate 10 is located within the orthographic projection of the thickness adjusting layer 71 on the flexible substrate 10. However, this embodiment is not limited thereto. In some examples, the orthographic projection of the micro-lens layer 72 on the flexible substrate 10 may overlap the orthographic projection of the thickness adjusting layer 71 on the flexible substrate 10.

In an exemplary embodiment, as shown in FIG. 2, on a direction perpendicular to the display substrate, the connection region 200 may include a flexible substrate 10, an inorganic insulating layer provided on the flexible substrate 10, a plurality of signal lines provided on the inorganic insulating layer (only one signal line 26 is illustrated in FIG. 2), a planarization layer 14, a thin film encapsulation layer 40, a hard mask layer 60, a third adhesive layer 70, a thickness adjusting layer 71, a first adhesive layer 80 and a first over coat layer 81 sequentially covering the signal lines 26, and a second adhesive layer 90 and a second over coat layer 91 disposed on a side of the flexible substrate 10 away from the display structure layer. The inorganic insulating layer may include a first insulating layer 11, a second insulating layer 12, and a third insulating layer 13 stacked on the flexible substrate 10. The plurality of signal lines of the connection region 200 are configured to enable signal communication between adjacent island-shaped display regions 100, for example, to transmit signals to or from one of the plurality of island-shaped display regions 100. Signal communication between adjacent island-shaped display regions refers to signal communication between light-emitting units in one island-shaped display region and light-emitting units in another adjacent island-shaped display region. The plurality of signal lines may include, for example, a connection line connecting a gate line in an adjacent island-shaped display region, a connection line connecting a data line in an adjacent island-shaped display region, and a connection line connecting a power signal. In some examples, the plurality of signal lines may be a plurality of flexible signal lines.

In some exemplary embodiments, as shown in FIG. 2, the flexible substrate 10 within each hollow region 300 is removed in a plane perpendicular to the display substrate. Each hollow region 300 may include a third adhesive layer 70, a thickness adjusting layer 71, a first adhesive layer 80 and a first over coat layer 81 sequentially disposed on a side of the display structure layer away from the flexible substrate 10, and a second adhesive layer 90 and a second over coat layer 91 sequentially disposed on a side of the flexible substrate 10 away from the display structure layer. By removing the flexible substrate 10, the display structure layer and the color filter layer, the hollow region 300 can provide room for deformation when the display substrate is stretched, thereby achieving a stretchable display substrate.

The following refers to FIGS. 2 to 13 and illustrates the technical solution of the embodiment by an example of the preparation process of the display substrate of the embodiment. The structural diagrams of FIGS. 2 to 13 are all cross-sectional views in the P-P direction of FIG. 1. The "patterning process" mentioned in this embodiment includes processes such as film deposition, photoresist coating, mask exposure, developing, etching and photoresist stripping. The deposition may be selected as any one or more of sputtering, evaporation and chemical vapor deposition, the coating may be selected as any one or more of spraying and spin coating, and etching may be selected as any one or more of dry etching and wet etching. A "thin film" refers to a thin film layer prepared from a material on a substrate by using a process of deposition or coating. If a patterning process or a photo-etching process is not needed for the "thin film" during the entire manufacturing process, the "thin film" may also be referred to as a "layer". If a patterning process or a photo-etching process is needed for the "thin film" during the entire manufacturing process, it is referred to as a "thin film" before the patterning process and referred to as a "layer" after the patterning process. The "layer" after the patterning process or photo-etching process includes at least one "pattern".

"A and B are disposed on the same layer" mentioned in the present disclosure refers to that A and B are simultaneously formed by the same patterning process. The "same layer" does not always mean that the thickness of the layer or the height of the layer is the same in a sectional view. "The orthographic projection of A contains the orthographic projection of B" refers to that the orthographic projection of B falls in a range of the orthographic projection of A or the orthographic projection of A covers the orthographic projection of B.

The process for preparing a display substrate according to the present exemplary embodiment includes following acts (1) to (12).

(1) Preparing a flexible substrate on a glass carrier. In some exemplary embodiments, a flexible material is coated on a glass carrier plate 1, and is cured into a film to form a flexible substrate 10. In some examples, the thickness of the flexible substrate 10 may range from 5 microns (μm) to 30 μm. In some examples, the flexible material may be made of polyimide (PI), polyethylene terephthalate (PET) or a surface-treated polymer soft film or the like.

Figure 3:
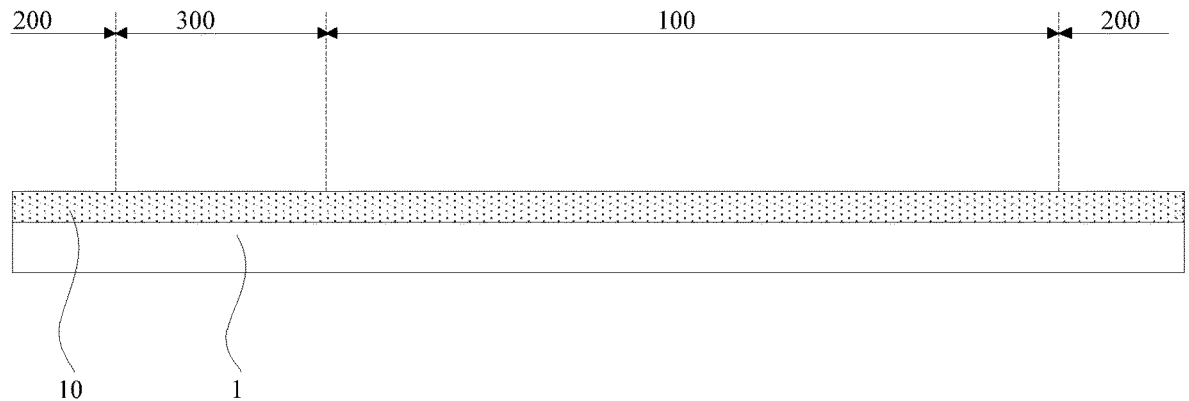
FIG. 3 is a schematic diagram of a display substrate after a flexible substrate is formed according to at least one embodiment of the present disclosure.

After this process, the island-shaped display region 100, the hollow region 300 and the connection region 200 each include a flexible substrate 10 as shown in FIG. 3.

(2) Preparing a drive structure layer on the flexible base substrate. The drive structure layer of the island-shaped display region 100 includes a plurality of driving circuits. Each drive circuit includes a plurality of transistors, or includes a plurality of transistors and at least one storage capacitor, which may be of a 2T1C, 3T1C, or 7T1C design, for example.

Figure 4:
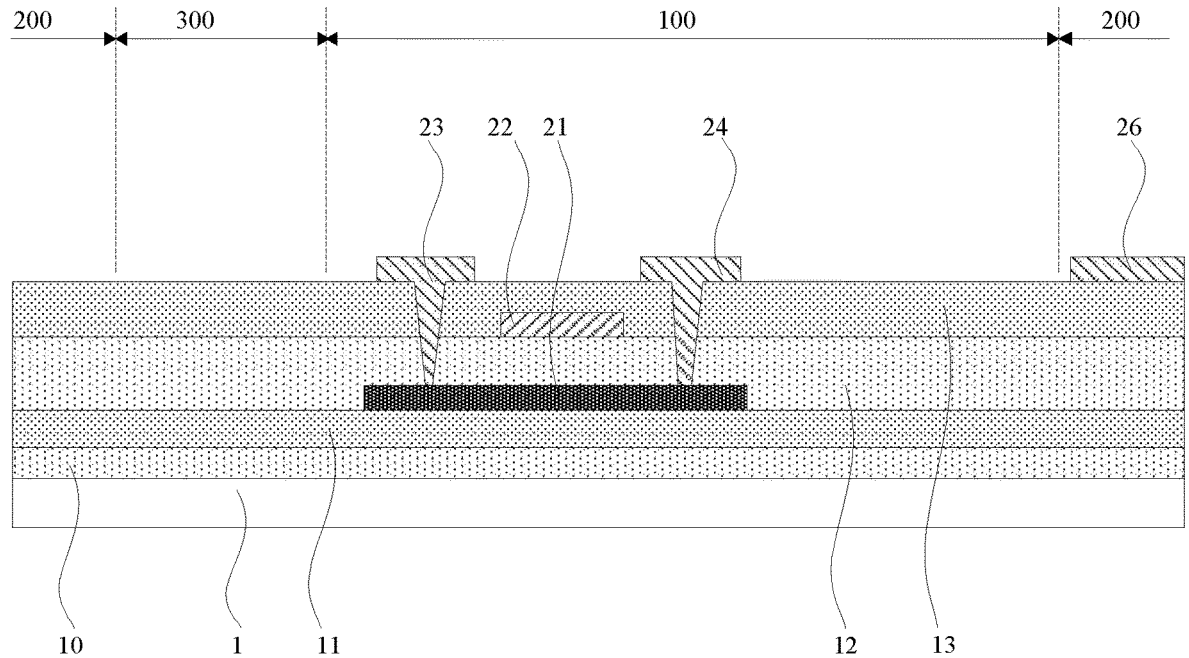
FIG. 4 is a schematic diagram of a display substrate after a drive structure layer is formed according to at least one embodiment of the present disclosure.

In some exemplary implementation modes, a preparation process of the drive structure layer may refer to the following descriptions. FIG. 4 illustrates only one Thin Film Transistor (TFT) of one driving circuit of the island-shaped display region 100 as an example.

A first insulating film and an active layer thin film are sequentially deposited on the flexible substrate 10, the active layer thin film is patterned by a patterning process to form a first insulating layer 11 covering the entire flexible substrate 10 and a pattern of an active layer disposed on the first insulating layer 11, wherein the active layer includes at least a first active layer.

Then, a second insulating film and a first metal film are sequentially deposited, and the first metal film is patterned by a patterning process to form a second insulating layer 12 covering the pattern of the active layer and a pattern of a gate metal layer disposed on the second insulating layer 12, wherein the gate metal layer at least includes a first gate electrode 22.

Then, a third insulation thin film is deposited and patterned by the patterning process to form a pattern of a third insulation layer 13 covering the gate metal layer, the third insulation layer 13 is provided with at least two first vias where the third insulation layer 13 and the second insulation layer 12 inside are etched, exposing the surface of the first active layer 21.

Subsequently, a second metal film is deposited and patterned through a patterning process to form a pattern of source-drain metal layer on the third insulating layer 13; the source-drain metal layer at least includes a first source electrode 23 and a first drain electrode 24 located in the island-shaped display region 100, and a signal line 26 located in the connection region 200. The first source electrode 23 and the first drain electrode 24 may be connected to the first active layer 21 through a first via hole. The signal line 26 of the connection region 200 may be configured to achieve signal communication between adjacent island-shaped display regions 100. In some examples, the signal line 26 may be a connection line connecting gate lines in adjacent island-shaped display regions 100 or a connection line connecting data lines in adjacent island-shaped display regions 100 or a connection line connecting a power signal. However, this embodiment is not limited thereto. In some examples, a connection line disposed within the connection region 200 and configured to connect gate lines in the adjacent island-shaped display regions 100 may be disposed in the same layer as the first gate electrode 22.

At this moment, the preparation of drive structure layers of a plurality of island-shaped display region 100 on the flexible substrate 10 is completed. As shown in FIG. 4, in a drive structure layer of an island-shaped display region 100, the first active layer 21, the gate electrode 22, the first source electrode 23, and the first drain electrode 24 may together form a first thin film transistor.

After this process, the connection region 200 includes a first insulating layer 11, a second insulating layer 12, a third insulating layer 13 and a signal line 26 stacked on the flexible substrate 10. The hollow region 300 includes the first insulation layer 11, the second insulation layer 12 and the third insulation layer 13 which are stacked on the flexible substrate 10.

In some exemplary embodiments, a first insulating layer 11, a second insulating layer 12 and a third insulating layer 13 may be made of any one or more of silicon oxide (SiOx), silicon nitride (SiNx) and silicon oxynitride (SiON), and may be a single layer, multiple layers or a composite layer. The first insulating layer 11 is referred to as a buffer layer, which is used to improve the water and oxygen resistance of the flexible substrate 10; the second insulating layer 12 is referred to as a gate insulator (GI) layer; and the third insulating layer 13 is referred to as an interlayer dielectric (ILD) layer. The first metal thin film and the second metal thin film may adopt metals such as any one or more of silver (Ag), copper (Cu), aluminum (Al), titanium (Ti) and molybdenum (Mo), or alloy of the above metals, such as aluminum neodymium alloy (AlNd) or molybdenum niobium alloy (MoNb) and the films may be of single-layered structure or multi-layered composite structure, for example Ti/Al/Ti etc. The active layer thin film is made of one or more of the materials such as amorphous indium gallium zinc oxide (a-IGZO), zinc oxynitride (ZnON), indium zinc tin oxide (IZTO), amorphous silicon (a-Si), polysilicon (p-Si), hexathiophene, or polythiophene, etc. That is, the present disclosure is applicable to transistors that are manufactured based on oxide technology, silicon technology and organics technology.

(3) Forming a planarization layer on the flexible substrate on which the aforementioned patterns are formed.

Figure 5:
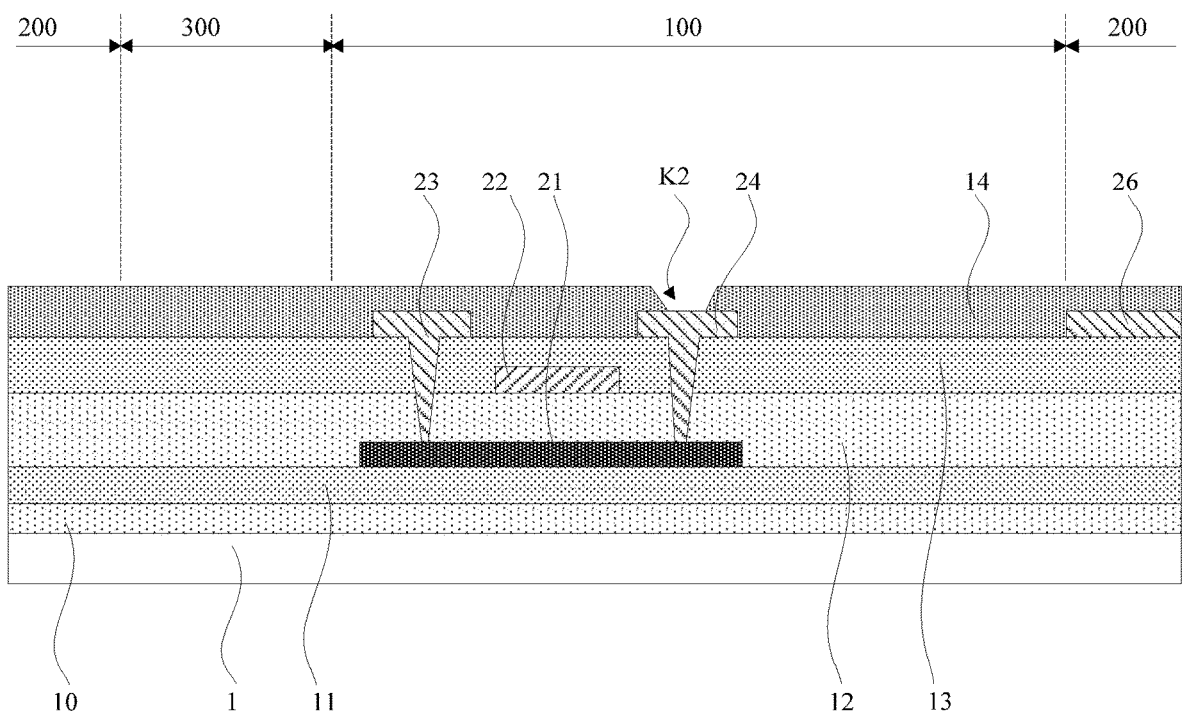
FIG. 5 is a schematic diagram of a display substrate after a planarization layer is formed according to at least one embodiment of the present disclosure.

In some exemplary embodiments, a planarization thin film of an organic material is coated on the flexible substrate 10 on which the above patterns have been formed to form a planarization (PLN) layer 14 covering the entire flexible substrate 10; a plurality of second vias K2 are formed on the planarization layer 14 in the island-shaped display region by masking, exposure and development processes. Only one second via K2 is illustrated in FIG. 5. The planarization layer 14 in the second via is developed off to expose the surface of the first drain electrode of the first thin film transistor 101.

After this patterning process, the connection region 200 includes the first insulating layer 11, the second insulating layer 12, the third insulating layer 13, the signal lines 26 and the planarization layer 14 covering the signal lines 26 stacked on the flexible substrate 10. The hollow region 300 includes a first insulating layer 11, a second insulating layer 12, a third insulating layer 13 and a planarization layer 14 stacked on the flexible substrate 10.

(4) Forming a pattern of a first electrode layer on the flexible substrate on which the aforementioned patterns are formed.

Figure 6:
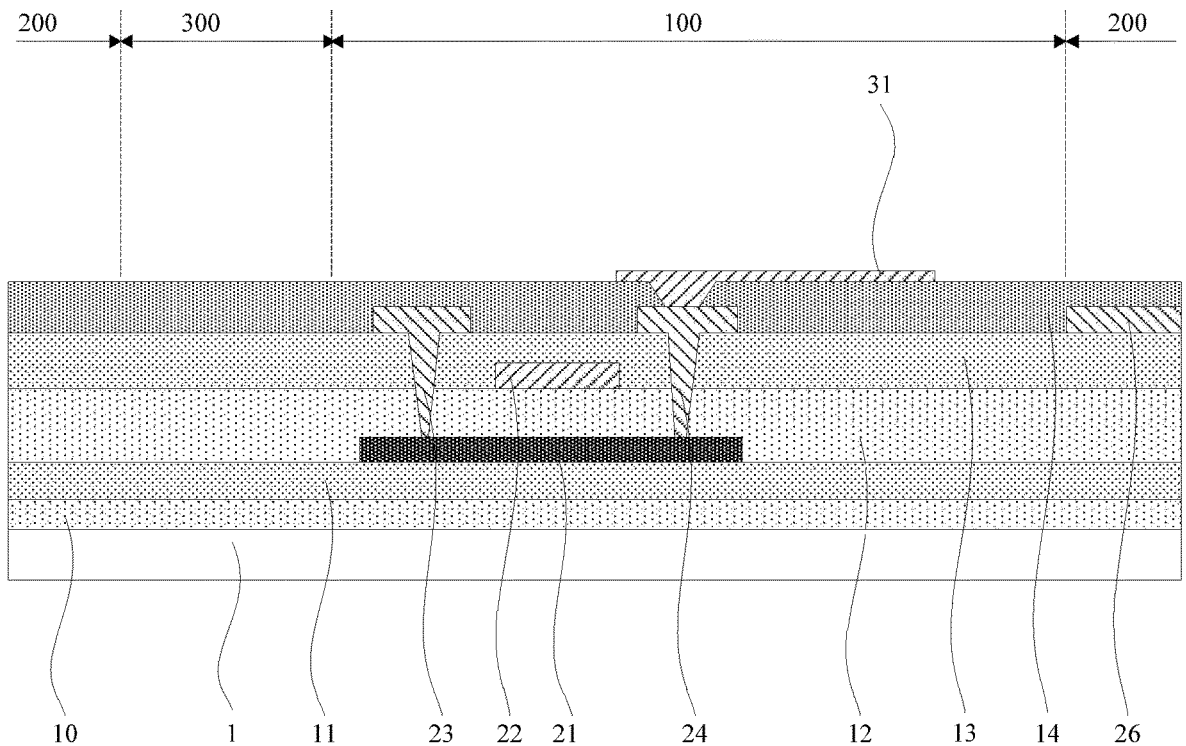
FIG. 6 is a schematic diagram of a display substrate after a first electrode layer is formed according to at least one embodiment of the present disclosure.

In some exemplary implementations, a conductive thin film is deposited on the flexible substrate 10 with the above-mentioned patterns formed. The conductive thin film is patterned through a patterning process to form a pattern of a first electrode layer. The first electrode layer is formed on the planarization layer 14 of the island-shaped display region 100. The first electrode layer includes a plurality of anodes. As shown in FIG. 6, only one anode 31 is schematically illustrated in FIG. 6. The anode 31 is connected to the first drain electrode 24 of the first thin film transistor through the second via K2.

In some exemplary embodiments, the plurality of anodes of the first electrode layer may be reflective anodes. The first electrode layer may include a first light-transmissive conductive layer, a reflective layer on the first light-transmissive conductive layer, and a second light-transmissive conductive layer on the reflective layer. The first light-transmissive conductive layer and the second light-transmissive conductive layer may be made of a light-transmissive conductive material such as Indium Tin Oxide (ITO) or Indium Zinc Oxide (IZO). The reflective layer may be a metal layer, for example, made of silver. However, this embodiment is not limited thereto. In some examples, a conductive film may be made of metal material, such as any one or more of magnesium (Mg), silver (Ag), copper (Cu), aluminum (Al), titanium (Ti) and molybdenum (Mo), or alloy of the above metals, such as aluminum neodymium alloy (AlNd) or molybdenum niobium alloy (MoNb), and may have a single-layered structure or a multi-layered composite structure, such as Ti/Al/Ti, etc.

After this patterning process, the film layer structures of the connection region 200 and the hollow region 300 are not changed.

(5) Forming a Pixel Define Layer (PDL) on the flexible substrate on which the patterns are formed.

Figure 7:
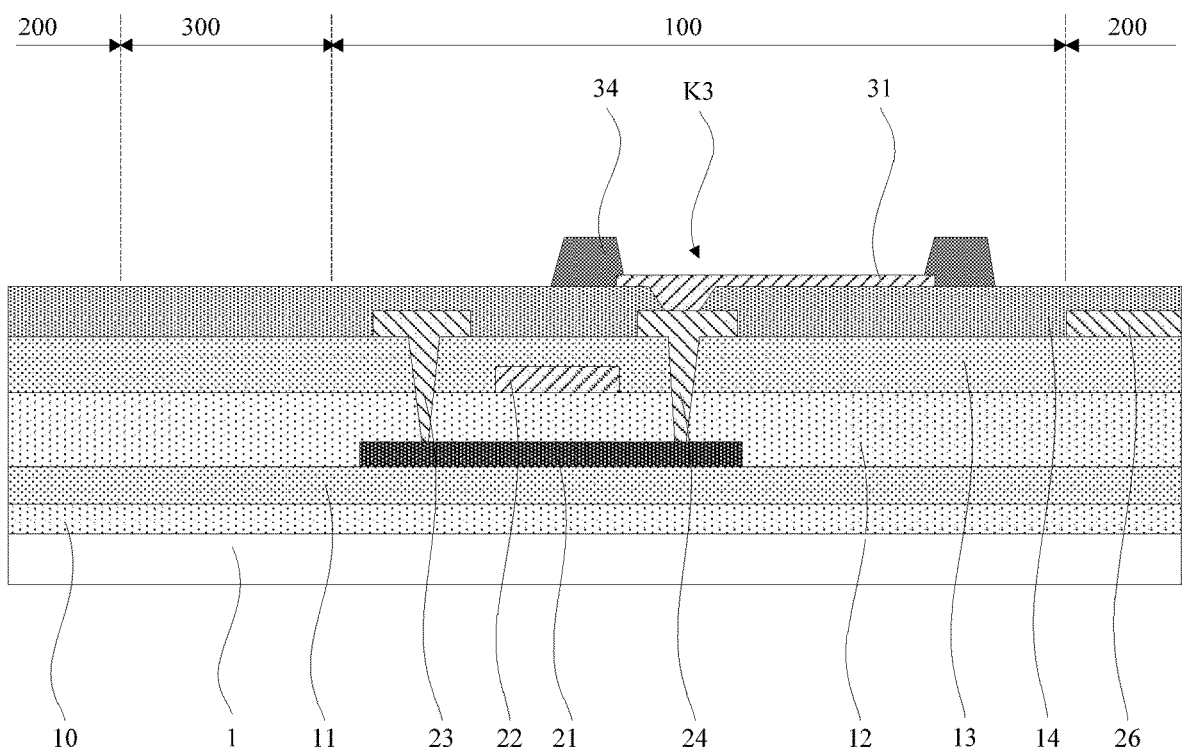
FIG. 7 is a schematic diagram of a display substrate after a pixel define layer is formed according to at least one embodiment of the present disclosure.

In some exemplary implementations, a pixel define thin film is coated on the flexible substrate 10 on which the aforementioned patterns are formed, and a pattern of the pixel define layer 34 is formed through masking, exposure, and development processes. As shown in FIG. 7, the pixel define layer 34 is formed in the island-shaped display region 100. A plurality of sub-pixel openings are provided on the pixel define layer 34. FIG. 7 is illustrated by only taking one pixel opening K3 as an example. The pixel define layer 34 in the sub-pixel opening K3 is developed, exposing the surface of the anode 31.

In some examples, the pixel define layer 34 may be made of materials such as polyimide, acrylic, or polyethylene terephthalate, etc.

After this process, the film layer structures of the connection region 200 and the hollow region 300 are not changed.

(6) Sequentially forming an organic emitting layer and a second electrode on the flexible substrate where the above-mentioned patterns are formed.

Figure 8:
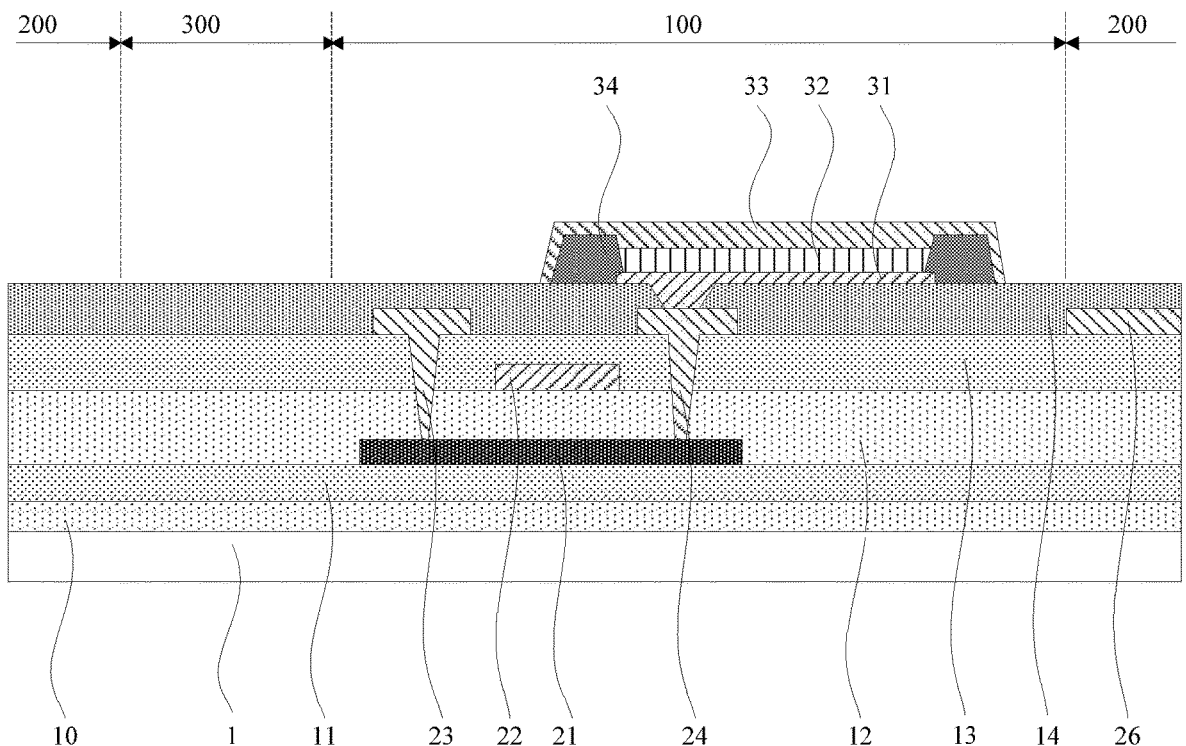
FIG. 8 is a schematic diagram of a display substrate after a second electrode layer is formed according to at least one embodiment of the present disclosure.

In some exemplary embodiments, the organic emitting layer 32 may be formed in the sub-pixel opening K3 of the pixel define layer 17 of the island-shaped display region 100 by means of evaporation or ink jet printing, and the connection between the organic emitting layer 32 and the anode 31 is implemented. Then, the second electrode 33 is formed on the pixel define layer 34 and the organic emitting layer 32 by means of evaporation, and the second electrode 33 is connected to the organic emitting layer 32, as shown in FIG. 8. The organic emitting layer 32 may include an emitting layer (EML). In some examples, the organic emitting layer may include a hole injection layer, a hole transporting layer, an emitting layer, an electron transporting layer, and an electron injection layer arranged sequentially, which may improve the efficiency of injecting electrons and holes into the emitting layer.

In some examples, the second electrode 33 is a transparent cathode, for example, a light-transmitting conductive material such as ITO or IZO may be used. The light-emitting element may emit light from a side away from the flexible substrate 10 through the transparent electrode so as to achieve top emission.

After this process, the film layer structures of the connection region 200 and the hollow region 300 are not changed.

(7) Forming a Thin-Film Encapsulation (TFE) layer on the flexible substrate on which the aforementioned patterns are formed.

Figure 9:
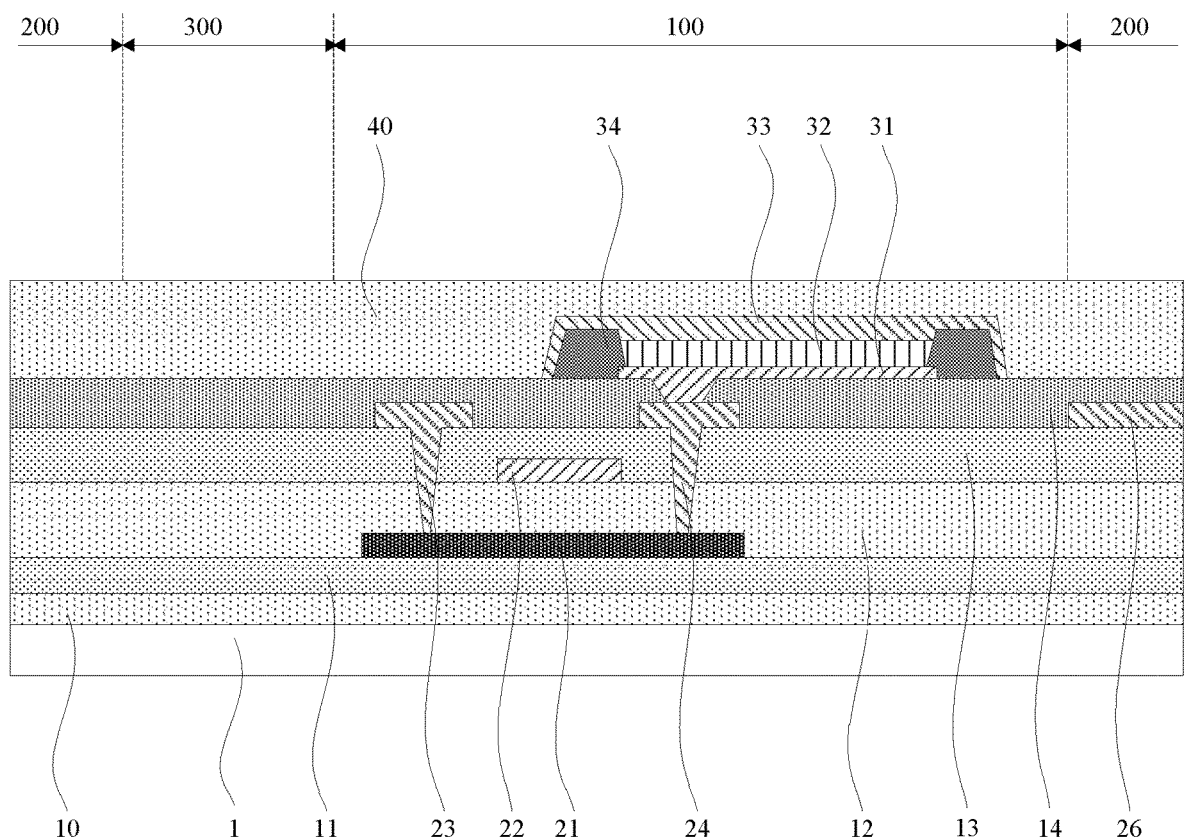
FIG. 9 is a schematic diagram of a display substrate after a thin film encapsulation layer is formed according to at least one embodiment of the present disclosure.

In some exemplary embodiments, an encapsulation thin film is coated on the flexible substrate 10 on which the aforementioned patterns are formed, and the encapsulation thin film covers the entire flexible substrate 10 to form a pattern of the thin film encapsulation layer 40 as shown in FIG. 9. In some examples, the encapsulation film may be an inorganic-organic laminated structure, such as inorganic/organic/inorganic three-layer structure or inorganic/organic/inorganic/organic/inorganic five-layer structure. Inorganic materials may be silicon oxide, alumina, silicon nitride or silicon oxynitride, etc. Organic materials may be flexible polymer materials based on PET with good encapsulation effect, which can effectively prevent water and oxygen from entering the organic emitting layer, and has flexible deformation characteristics, thereby achieving tensile deformation of the display substrate.

After this patterning process, the connection region 200 includes the first insulating layer 11, the second insulating layer 12, the third insulating layer 13, the signal lines 26 and a planarization layer 14 and a thin film encapsulation layer 40 sequentially covering the signal lines 26, which are all stacked on the flexible substrate 10. The hollow region 300 includes a first insulating layer 11, a second insulating layer 12, a third insulating layer 13 and a planarization layer 14 and a thin film encapsulation layer 40 which are stacked on the flexible substrate 10.

(8) Forming a color filter layer and a Hard Mask layer on a flexible substrate on which the pattern is formed.

Figure 10:
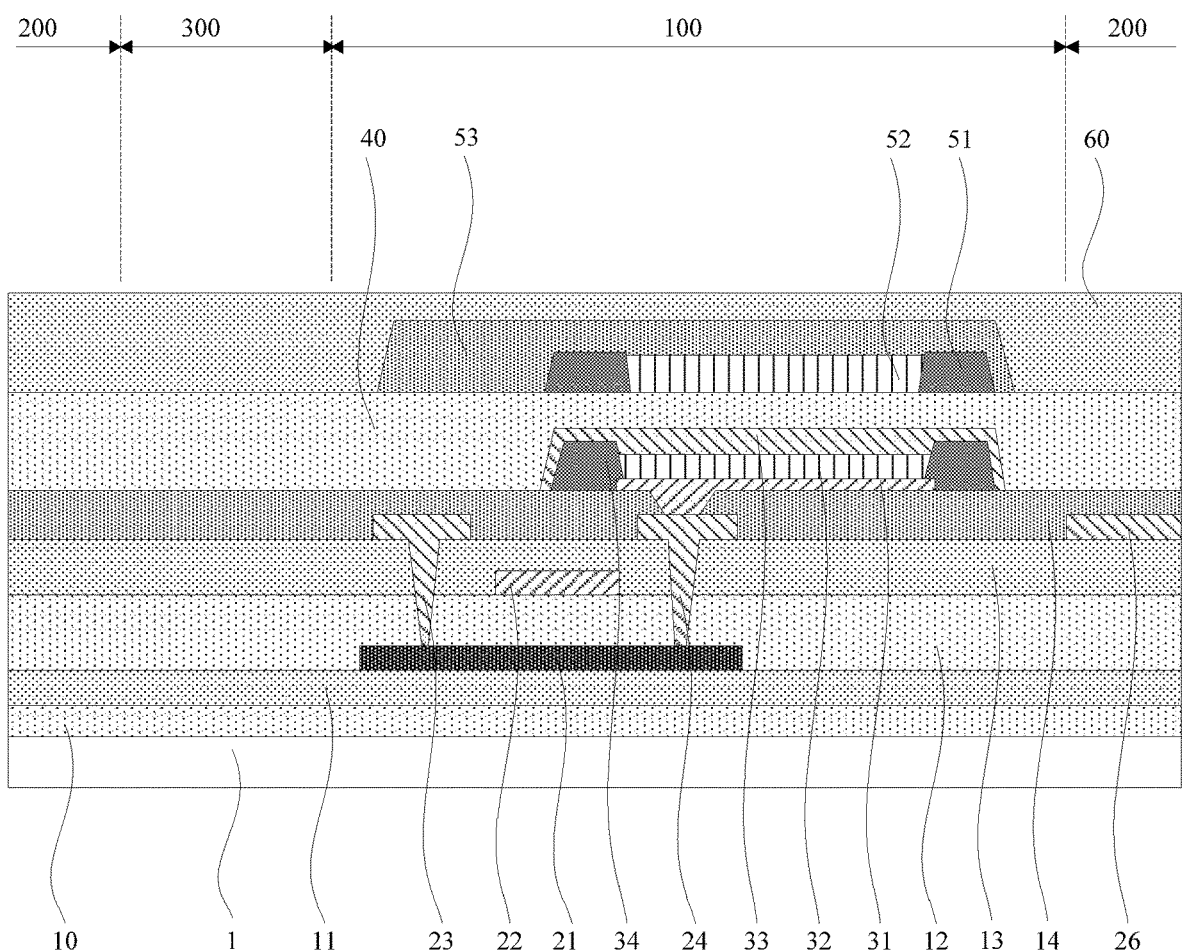
FIG. 10 is a schematic diagram of a display substrate after a hard mask layer is formed according to at least one embodiment of the present disclosure.

In some exemplary embodiments, a black pigment is coated or a black chromium (Cr) thin film is deposited on the flexible substrate 10 on which the aforementioned patterns are formed, the black pigment or the black chromium thin film is patterned through a patterning process to form a pattern of a black matrix 51. Then filter units 52 of different colors are sequentially formed in sub-pixel regions defined by the black matrix 51, and an organic material is coated on the island-shaped display region 100 to form a filter Over Coat (OC) layer 53 covering the filter units 52 and the black matrix 51, as shown in FIG. 10. In FIG. 10, only one filter unit 52 is taken as an example. The color filter layer includes a black matrix 51, a plurality of filter units 52 disposed in a sub-pixel region defined by the black matrix 51 and corresponding to a plurality of light-emitting units one to one, and a filter over coat layer 53 covering the black matrix 51 and the filter units 52. A color filter layer is formed in the island-shaped display region 100. The color of each of the filter units 52 is the same as the light-emitting color of the light-emitting elements overlapping in a direction perpendicular to the display substrate. In some examples, the color filter layer may include periodically arranged red filter units, green filter units, and blue filter units. The red filter units correspond to the red light-emitting units one to one, the green filter units correspond to the green light-emitting units one to one, and the blue filter units correspond to the blue light-emitting units one to one. Taking the formation of the red filter unit as an example, the thin film encapsulation layer formed with the black matrix may be coated with a red resin at first, and after baking-curing the red filter units are formed by masking, exposure and development. The green filter units and the blue filter units are formed through similar processes, which will not be repeated herein.

In some exemplary embodiments, the material used to form the color filter layer may be a low temperature curing material and the curing temperature is less than 100 degrees to avoid affecting the organic emitting layer.

In some exemplary embodiments, a hard mask layer 60 is formed by deposition of an inorganic material at a low temperature on a flexible substrate 10 on which a color filter layer is formed. For example, the hard mask layer 60 may be made of any one or more of silicon oxide (SiOx), silicon nitride (SiNx), and silicon oxynitride (SiON). Since the film layer structure of the hollow region 300 needs to be etched off in a subsequent process, providing the hard mask layer 60 can protect the non-etched region from being damaged by the etching gas.

After this patterning process, the connection region 300 includes the first insulating layer 11, the second insulating layer 12, the third insulating layer 13, the signal lines 26 and a planarization layer 14, a thin film encapsulation layer 40 and a hard mask layer 60 sequentially covering the signal lines 26, which are all stacked on the flexible substrate 10. The hollow region 300 includes a first insulating layer 11, a second insulating layer 12, a third insulating layer 13 and a planarization layer 14, a thin film encapsulation layer 40 and a hard mask layer 60 which are stacked on the flexible substrate 10.

Figure 11:
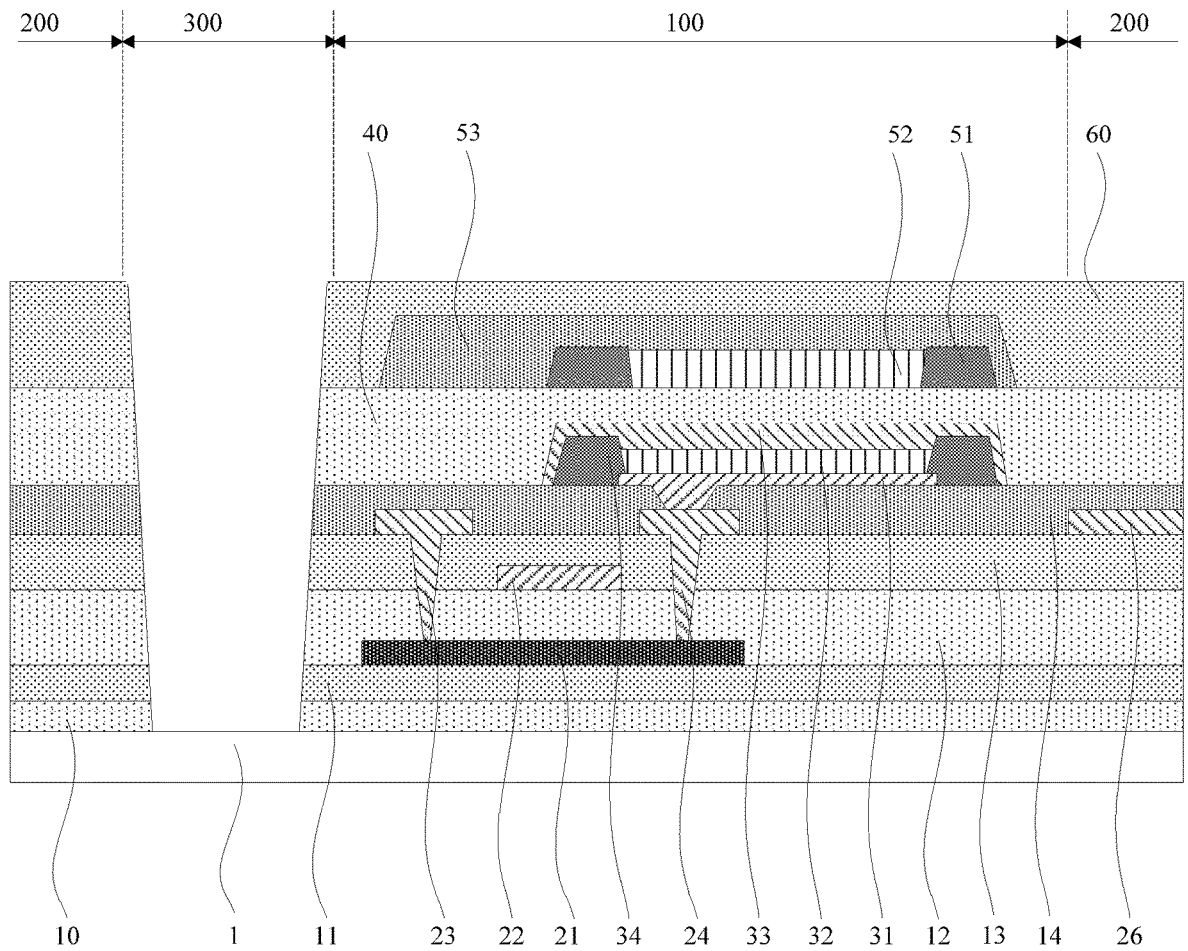
FIG. 11 is a schematic diagram of a display substrate after the film structure of the hollow region is etched according to at least one embodiment of the present disclosure.

(9) Etching the entire film layer structure of the hollow region 300 by a dry etching process on the flexible substrate 10 on which the patterns are formed. The flexible substrate 10, the first insulating layer 11, the second insulating layer 12, the third insulating layer 13, the planarization layer 14, the thin film encapsulation layer 40 and the hard mask layer 60 in the hollow region 300 are all etched away, as shown in FIG. 11. After this process, the structure of the film layers in the island-shaped display region 100 and the connection region 200 does not change.

So far, the flexible substrate body is prepared on the flexible substrate 10. The island-shaped display region 100 includes a flexible substrate 10, and a drive structure layer, a light-emitting structure layer, a thin film encapsulation layer 40, a color filter layer and a hard mask layer 60 stacked on the flexible substrate 10. The hollow region 300 is an opening region penetrating the flexible substrate body. The connection region 300 includes a flexible substrate 10, and a first insulating layer 11, a second insulating layer 12, a third insulating layer 13, a signal line 26, and a planarization layer 14, a thin film encapsulation layer 40, and a hard mask layer 60 sequentially covering the signal line 26, which are stacked on the flexible substrate 10.

(10) Forming a thickness adjusting layer and a micro-lens layer on the flexible substrate on which the aforementioned patterns are formed.

Figure 12:
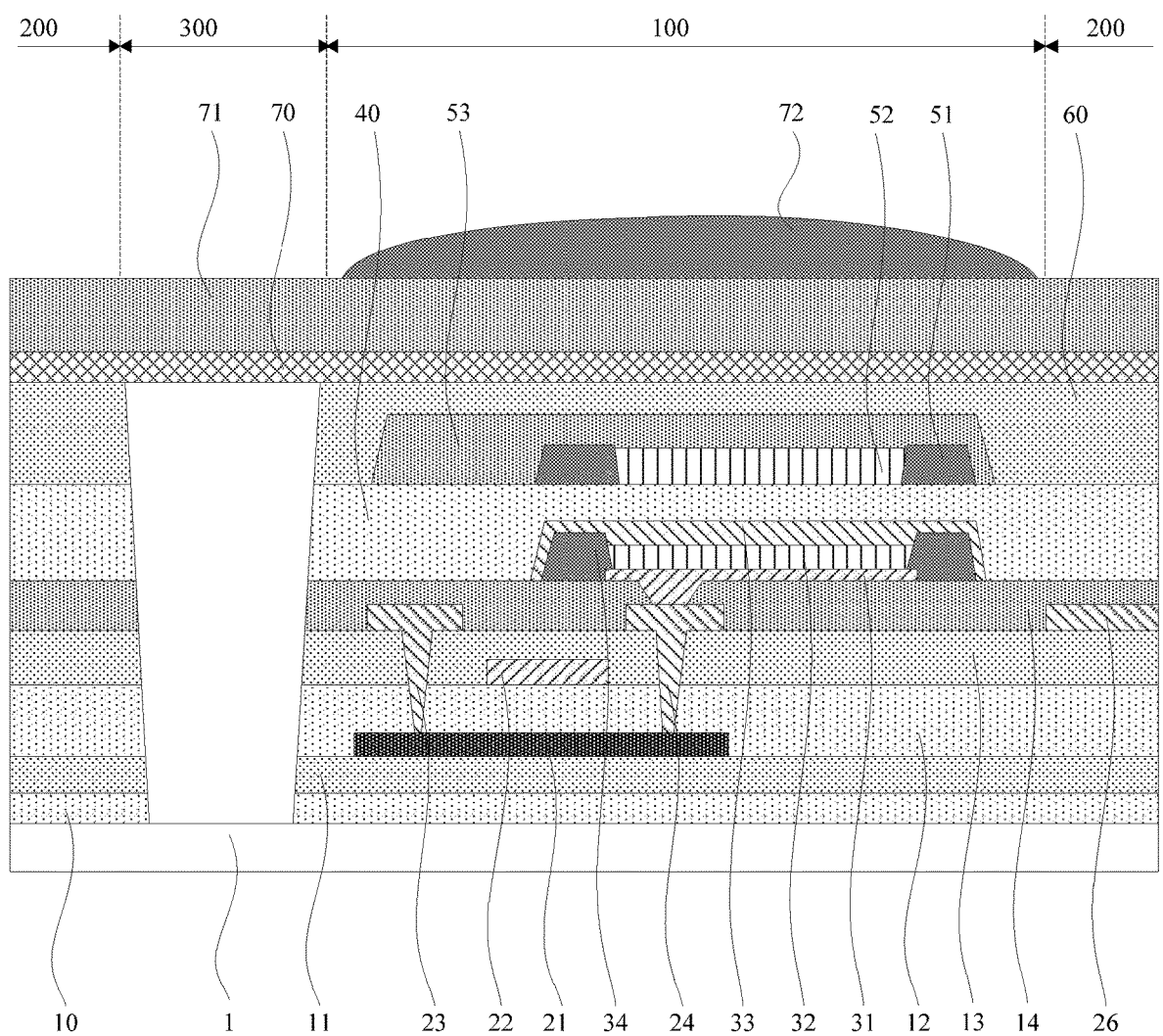
FIG. 12 is a schematic diagram of a display substrate after a micro-lens layer is formed according to at least one embodiment of the present disclosure.

In some exemplary embodiments, an Optically Clear Adhesive (OCA) is coated on the flexible substrate 10 on which the aforementioned patterns are formed to form a third adhesive layer 70, and a thickness adjusting material is coated on the third adhesive layer 70 to form a Thickness Adjusting Layer (TAL) 71, and then a micro-lens layer 72 is prepared on the thickness adjusting layer 71 using an imprint process, as shown in FIG. 12. The thickness adjusting layer 71 may be adhered to the hard mask layer 60 through the third adhesive layer 70, and the micro-lens layer 72 is located on the thickness adjusting layer 71. The thickness adjusting layer 71 may be used as a carrier of the micro-lens layer 72 to carry the micro-lens layer 72. The orthographic projection of the thickness adjusting layer 71 on the glass carrier 1 includes the orthographic projection of the micro-lens layer 72 on the glass carrier 1. For example, the orthographic projection of the thickness adjusting layer 71 on the glass carrier 1 may cover the island-shaped display region 100, the connection region 200, and the hollow region 300, and the orthographic projection of the micro-lens layer 72 on the glass carrier 1 is located within a plurality of the island-shaped display regions 100. However, this embodiment is not limited thereto. In some examples, the orthographic projection of the micro-lens layer on the glass carrier is located within a plurality of island-shaped display regions, and the orthographic projection of the thickness adjusting layer on the glass carrier may cover the plurality of island-shaped display regions without overlapping the connection regions and the hollow regions.

In some exemplary embodiments, the thickness adjusting material may be a material with a high elastomeric stretch such as PDMS, SEBS, Ecoflex, etc. The optical adhesive may be made of acrylic resin. The micro-lens layer 72 may be made of an organic resin-based material.

In some exemplary embodiments, as shown in FIGS. 1 and 12, the micro-lens layer 72 may include a plurality of micro-lenses 720. At least one micro-lens 720 may be a plano-convex lens. The plano-convex lens includes oppositely arranged plane and convex surfaces. The plane of the plano-convex lens is adjacent to the thickness adjusting layer 71 and the convex surface is away from the thickness adjusting layer 71. However, this embodiment is not limited thereto. In some examples, at least one micro-lens may be a lenticular lens. In addition, in some examples, the types of the plurality of micro-lenses of the micro-lens layer 72 may be the same or partially the same or all different.

In some exemplary embodiments, as shown in FIGS. 1 and 12, an island-shaped display region 100 may correspond to a micro-lens 720. An island-shaped display region 100 includes only the orthographic projection of a micro-lens 720 on the flexible substrate 10. However, this embodiment is not limited thereto. In some examples, the orthographic projection of a micro-lens on a flexible substrate may overlap only one island-shaped display region, as well as a hollow region and a connection region around the island-shaped display region.

Figure 14:
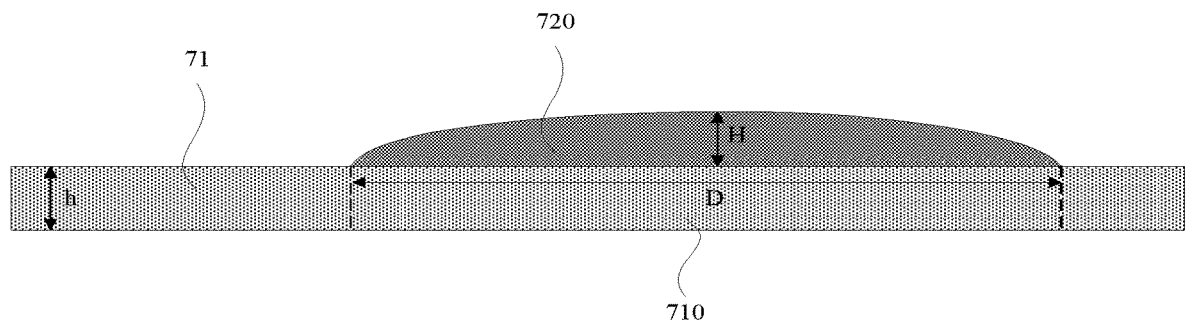
FIG. 14 is a dimensional diagram of a thickness adjusting layer and a micro-lens of a micro-lens layer according to at least one embodiment of the present disclosure.

FIG. 14 is a schematic diagram of the dimensions of a micro-lens 720 of a thickness adjusting layer 71 and a micro-lens layer 72 according to at least one embodiment of the present disclosure. In some examples, the thickness adjusting layer 71 may include a plurality of thickness adjusting regions 710 which correspond one-to-one with a plurality of micro-lenses 720. The orthographic projection of any thickness adjusting region 710 on the flexible substrate body includes the orthographic projection of the corresponding micro-lens 720 on the flexible substrate body. The correlation between the micro-lens 720 and the thickness of the corresponding thickness adjusting region 710 is $1/f=1/h+1/L$, where f denotes the focal length of the micro-lens, h denotes the thickness of the thickness adjusting region, and L denotes the distance between the human eye and the display substrate. Clear imaging may be achieved by matching the thickness of the thickness adjusting layer with the focal length of the micro-lens. In some examples the thicknesses of the plurality of thickness adjusting regions may be identical, or different, or partially identical. However, this embodiment is not limited thereto.

In some examples, the micro-lens layer 72 includes a plurality of micro-lenses 720 in one-to-one correspondence with a plurality of island-shaped display regions, and the plurality of micro-lenses 720 are of the same type (e.g. all of them are plano-convex lenses) and of the same dimension. When the size range of each island-shaped display region 100 is 0.1 mm (mm)×0.1 mm to 1.5 mm×1.5 mm, the diameter D of the micro-lens 720 corresponding to the island-shaped display region may range from about 0.1 mm to about 1.5 mm, the center thickness H of the micro-lens 720 may range from about 10 mum to about 80 μm, and the thickness h of the thickness adjusting layer may range from about 3 mm to about 15 μm.

(11) Forming a pattern of a first over coat layer on the flexible substrate on which the aforementioned patterns are formed.

Figure 13:
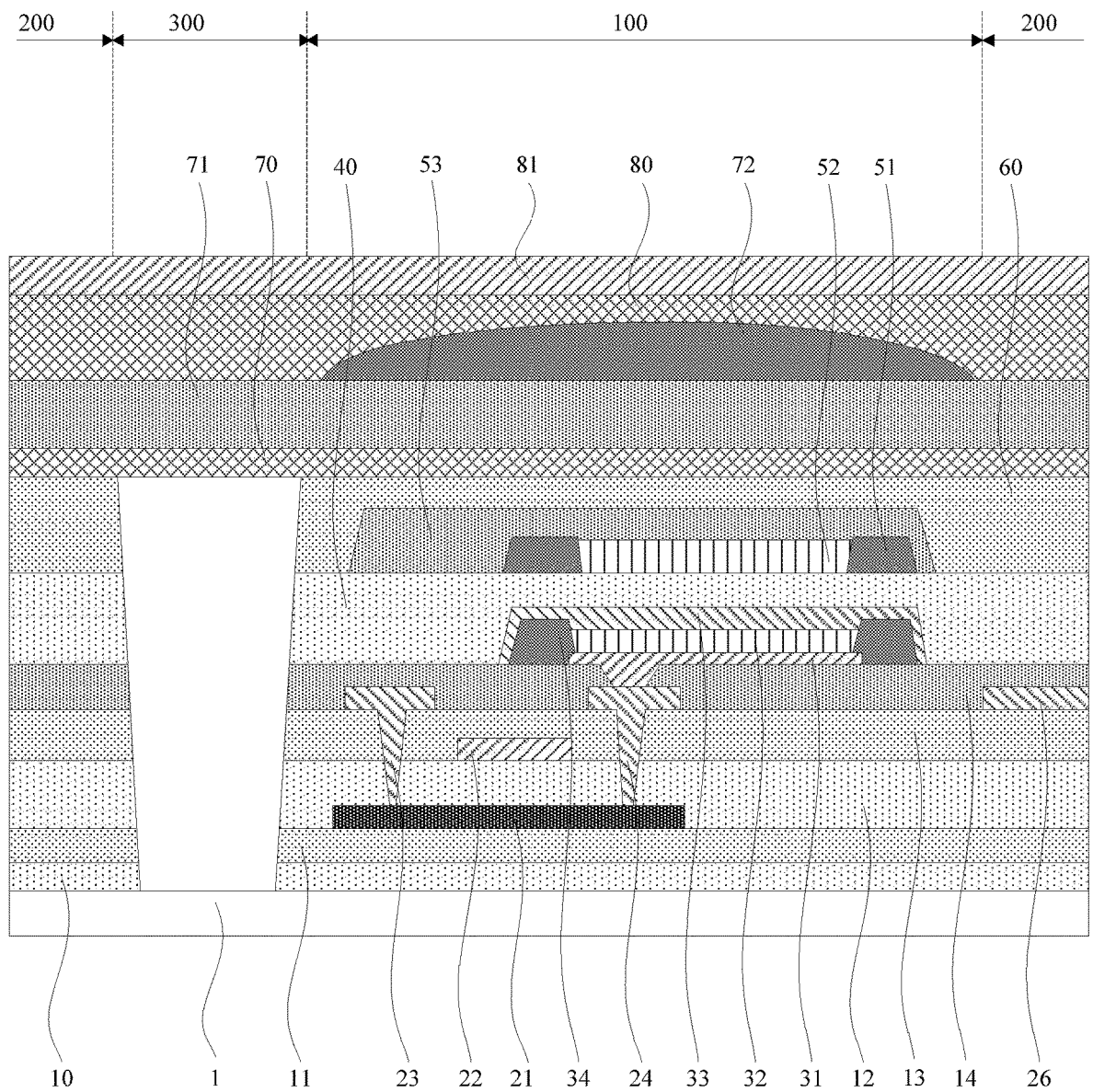
FIG. 13 is a schematic diagram of a display substrate after a first over coat layer is formed according to at least one embodiment of the present disclosure.

In some exemplary embodiments, an optical adhesive is coated on the flexible substrate 10 on which the aforementioned patterns are formed to form a first adhesive layer 80, and a first over coat thin film is coated on the first adhesive layer 80 to form a first over coat layer 81, as shown in FIG. 13. The first over coat layer 81 is adhered to the micro-lens layer 72 through the first adhesive layer 80 to protect the micro-lens layer 72.

In some examples, the first over coat thin film may be made of a material having a high elasticity such as PDMS, SEBS, Ecoflex, etc. The optical adhesive may be made of acrylic resin.

(12) Forming a pattern of a second over coat layer on the flexible substrate on which the aforementioned patterns are formed.

In some exemplary embodiments, the flexible substrate 10 is peeled off from the glass carrier 1 by a laser peeling process, and an optical adhesive is coated on the side of the flexible substrate 10 being peeled off from the glass carrier 1 to form a second adhesive layer 90, and a second over coat thin film is coated on the second adhesive layer 90 to form a second over coat layer 91, as shown in FIG. 2. The second over coat layer 91 is adhered to the flexible substrate 10 through the second adhesive layer 90 to protect the flexible substrate 10.

In some examples, the second over coat thin film may be made of a material with a high elasticity such as PDMS, SEBS, Ecoflex, etc. The optical adhesive may be made of acrylic resin.

The description of a structure and preparation process of a display substrate of this embodiment is merely illustrative. In some exemplary embodiments, changes in corresponding structures and, addition or deletion of patterning processes may be made according to actual needs. For example, the drive structure layer may include two gate metal layers, the first gate metal layer may include a gate electrode of the thin film transistor and an electrode of the storage capacitor, and the second gate metal layer may include another electrode of the storage capacitor. As another example, the flexible substrate may be manufactured to contain a hollow region itself. Which is not limited the present disclosure is not limited thereto.

Figure 15:
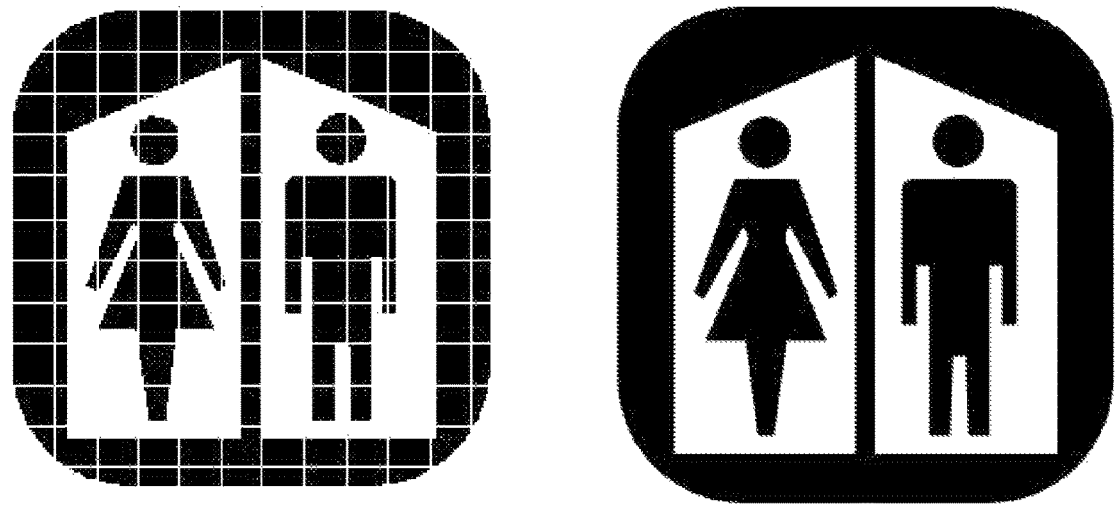
FIG. 15 includes FIG. 15 (a) and FIG. 15 (b) and is a comparative view of the display effect of the display substrate.

FIG. 15 is an effect comparison diagram of a display substrate according to at least one embodiment of the disclosure. FIG. 15 (*a*) is a schematic diagram showing an example of a display effect of a display substrate on which the thickness adjusting layer and the micro-lens layer are not provided, and FIG. 15 (*b*) is a schematic diagram showing an example of a display effect of a display substrate on which the thickness adjusting layer and the micro-lens layer are provided. As shown in FIG. 15 (*a*), since only a plurality of island-shaped display regions can display images while the hollow regions and the connection regions cannot display images, the images displayed on the display substrate are island-shaped mosaic images, which affects the display effect. As shown in FIG. 15 (*b*), through the coordination of the thickness adjusting layer and the micro-lens layer, the images displayed in a plurality of island-shaped display regions may be enlarged according to a certain proportion, so that the images observed by human eyes have no splicing seams, or the influence of splicing seams is greatly weakened, and the display effect is optimized. The distance between the micro-lens and the light-emitting unit may be adjusted by the thickness adjusting layer, and the magnification ratio of the displayed image may be controlled by matching the focal length of the micro-lens.

Figure 16:
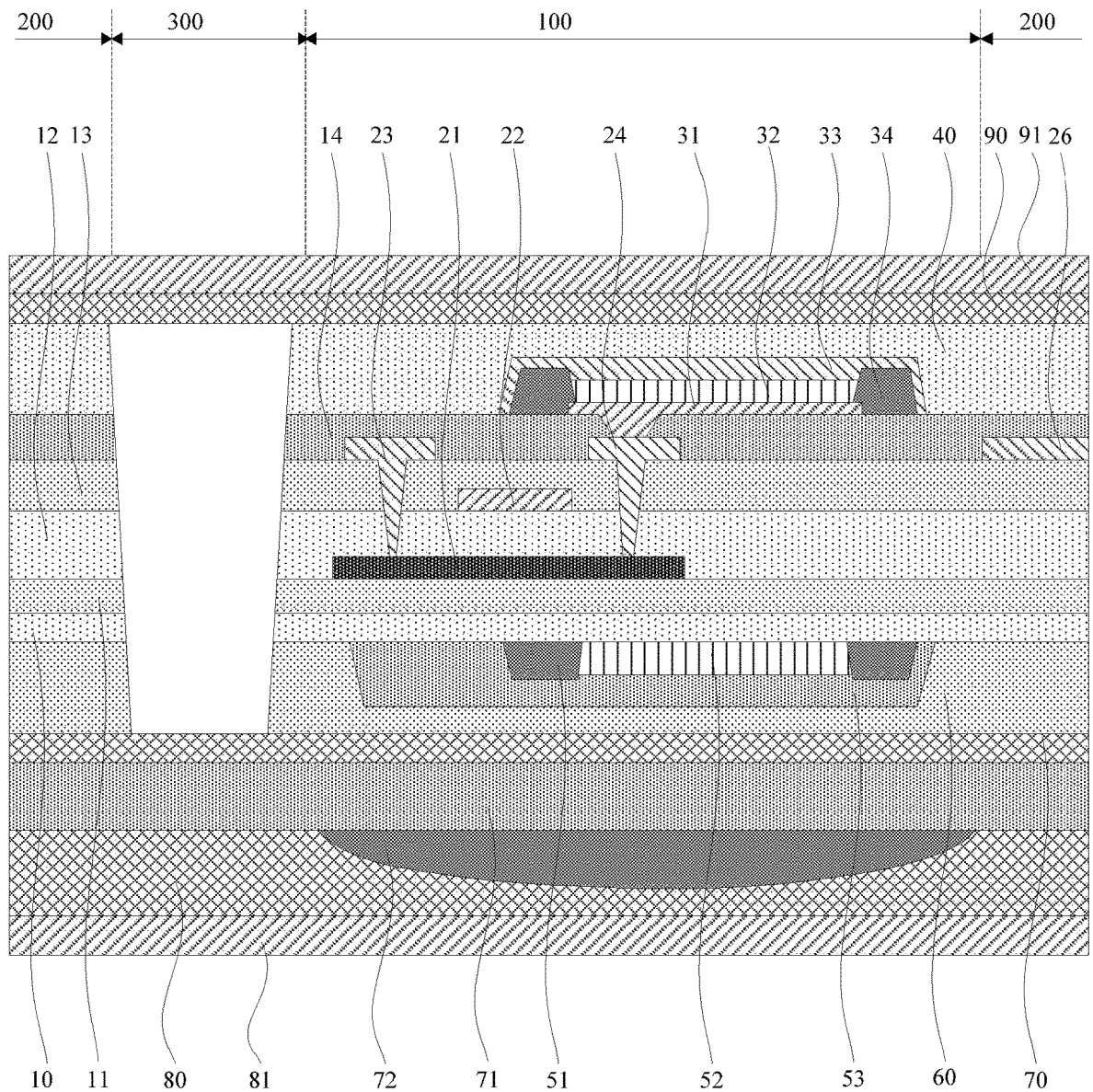
FIG. 16 is a schematic diagram of another structure of a display substrate according to at least one embodiment of the present disclosure.

FIG. 16 is schematic diagram of another structure of a display substrate according to at least one embodiment of the present disclosure. FIG. 16 is a schematic sectional view along a P-P direction in FIG. 1. The display substrate of the present exemplary embodiment is of a bottom emission structure. As shown in FIG. 16, on a plane perpendicular to the display substrate, at least one island-shaped display region 100 may include: a flexible substrate 10, a display structure layer, an encapsulation film layer 40, a second adhesive layer 90 and a second over coat layer 91 sequentially disposed on a first side of the flexible substrate 10, and a color filter layer, a hard mask layer 60, a third adhesive layer 70, a thickness adjusting layer 71, a micro-lens layer 72, a first adhesive layer 80 and a first over coat layer 81 sequentially disposed on a second side of the flexible substrate 10. The first side and the second side are opposite sides of the flexible substrate 10. The display structure layer of at least one island-shaped display region 100 includes a drive structure layer and a light-emitting structure layer stacked on the flexible substrate 10. The drive structure layer includes a plurality of driving circuits. Each of the driving circuits includes a plurality of transistors or includes a plurality of transistors and at least one storage capacitor, for example, may be a 2T1C, 3T1C or 7T1C design. The light-emitting structure layer includes a plurality of light-emitting elements. A plurality of driving circuits are connected to a plurality of light-emitting elements in one-to-one correspondence. Each light-emitting element includes a first electrode 31 (e.g. a transparent anode), an organic emitting layer 32 and a second electrode 33 (e.g. a reflective cathode). The color filter layer includes a black matrix 51 provided on a encapsulation thin film layer 40, a plurality of filter units 52 located in a sub-pixel region defined by the black matrix 51 and in one-to-one correspondence with a plurality of light-emitting elements, and a filter over coat layer 53 covering the black matrix 51 and the plurality of filter units 52. In FIG. 16, only one transistor, one light-emitting element and one filter unit are illustrated as examples. The orthographic projection of the micro-lens layer 72 on the flexible substrate 10 is located within the orthographic projection of the thickness adjusting layer 71 on the flexible substrate 10. However, this embodiment is not limited thereto. In some examples, the orthographic projection of the micro-lens layer 72 on the flexible substrate 10 may overlap the orthographic projection of the thickness adjusting layer 71 on the flexible substrate 10.

In some exemplary embodiments, as shown in FIG. 16, on a plane perpendicular to the display substrate, At least one connection region 200 may include a flexible substrate 10, an inorganic insulating layer provided on a first side of the flexible substrate 10, a plurality of signal lines provided on the inorganic insulating layer (only one signal line 26 is illustrated in FIG. 16), a planarization layer 14, a thin film encapsulation layer 40, a second adhesive layer 90 and a second over coat layer 91 covering the signal lines 26 in turn, and a third adhesive layer 70, a thickness adjusting layer 71, a first adhesive layer 80, and a first over coat layer 81 that are sequentially disposed on a second side of the flexible substrate 10. The inorganic insulating layer may include a first insulating layer 11, a second insulating layer 12, and a third insulating layer 13 stacked on the flexible substrate 10.

In some exemplary embodiments, as shown in FIG. 16, the flexible substrate 10 within the hollow region 300 is removed in a plane perpendicular to the display substrate. The hollow region 300 may include a second adhesive layer 90 and a second over coat layer 91 sequentially disposed on the first side of the flexible substrate 10, and a third adhesive layer 70, a thickness adjusting layer 71, a first adhesive layer 80 and a first over coat layer 81 sequentially disposed on the second side of the flexible substrate 10.

The related structures of the island-shaped display region, the connection region and the hollow region, and the related structures of the thickness adjusting layer and the micro-lens layer of the present embodiment may be referred to the description of the above embodiments, so that they will not be repeated here.

The structure (or method) shown in this embodiment may be combined with structures (or methods) shown in other embodiments as appropriate.

Figure 17:
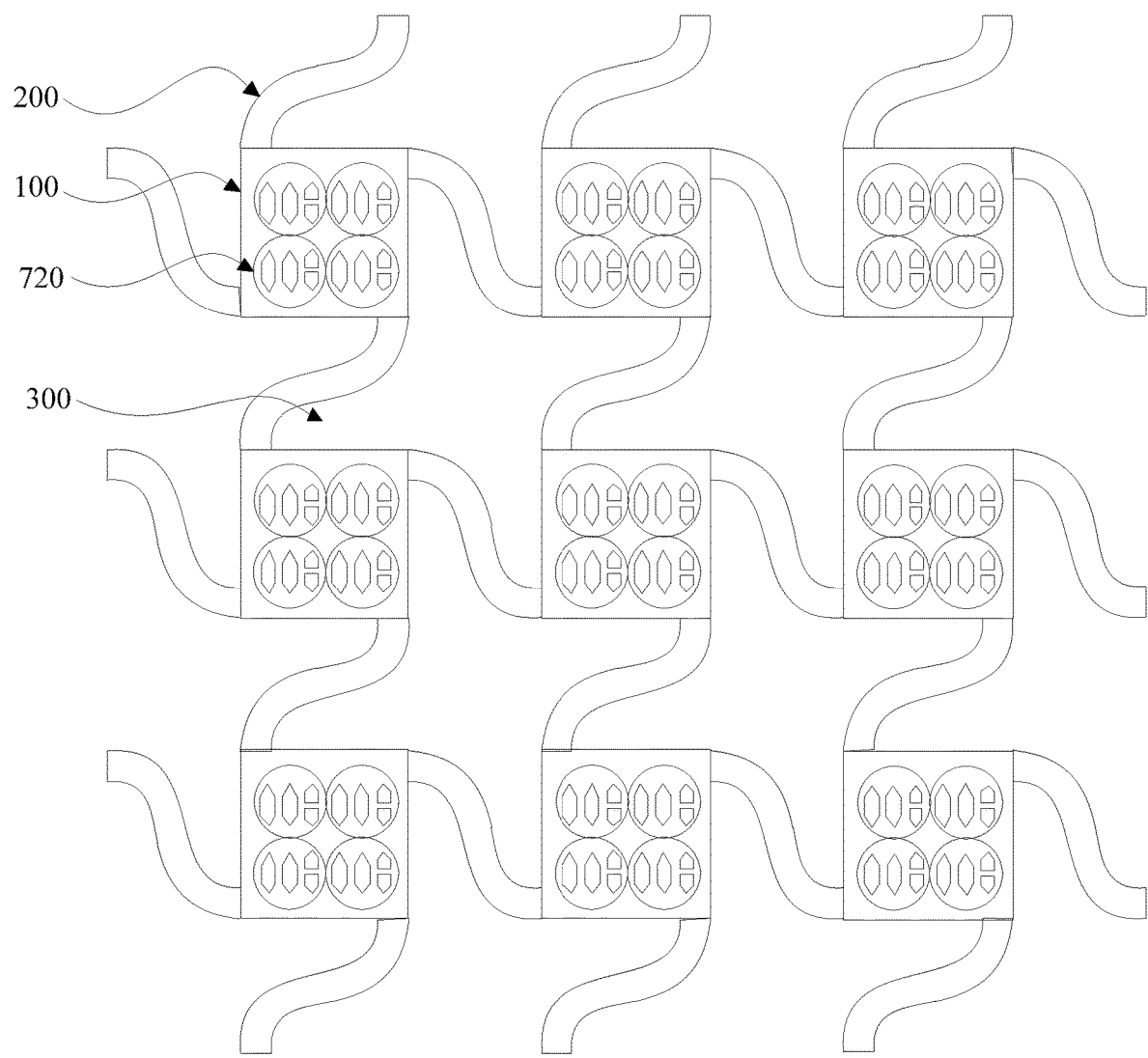
FIG. 17 is a schematic diagram of yet another structure of a display substrate according to at least one embodiment of the present disclosure.

FIG. 17 is a schematic diagram of yet another structure of a display substrate according to at least one embodiment of the present disclosure. In some exemplary embodiments, as shown in FIG. 17, a micro-lens layer may include a plurality of micro-lenses 720 on a plane parallel to the display substrate. An island-shaped display region 100 includes the orthographic projection of at least two micro-lenses 720 (e.g. four micro-lenses) on the display substrate body. In other words, the plurality of micro-lenses 720 correspond to one island-shaped display region 100. In some examples, as shown in FIG. 17, each island-shaped display region 100 may be square, and the orthographic projection of each micro-lens 720 on the display substrate body may be circular. The orthographic projection of each micro-lens 720 on the display substrate body may cover at least one light-emitting unit in an island-shaped display region 100, and there is no overlap between adjacent micro-lenses 720.

The structure (or method) shown in this embodiment may be combined with structures (or methods) shown in other embodiments as appropriate.

Figure 18:
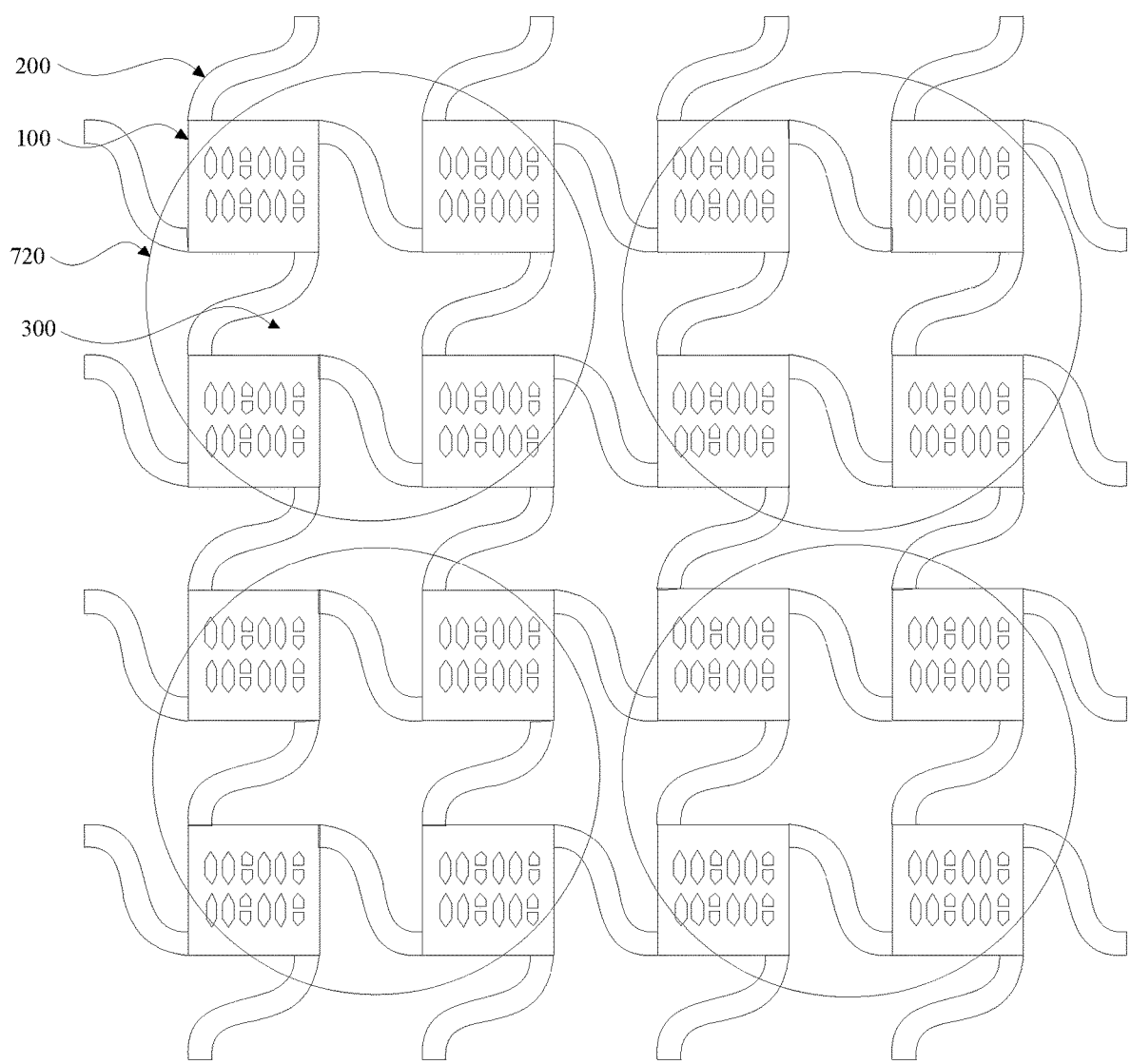
FIG. 18 is a schematic diagram of a still structure of a display substrate according to at least one embodiment of the present disclosure.

FIG. 18 is a schematic diagram of a still structure of a display substrate according to at least one embodiment of the present disclosure. In some exemplary embodiments, as shown in FIG. 18, a micro-lens layer may include a plurality of micro-lenses 720 in a direction parallel to the display substrate. The orthographic projection of a micro-lens 720 on the display substrate body may overlap a plurality of island-shaped display regions 100 (e.g. four island-shaped display regions) and a plurality of connection regions 200 and hollow regions 300 around the island-shaped display regions. In other words, one micro-lens 720 corresponds to a plurality of island-shaped display regions 100. In some examples, as shown in FIG. 18, each island-shaped display region 100 may be square, and the orthographic projection of each micro-lens 720 on the display substrate body may be circular. The orthographic projection of each micro-lens 720 on the display substrate body may overlap the four island-shaped display regions 100, and there is no overlap between adjacent micro-lenses. In this exemplary embodiment, the display images of a plurality of island-shaped display regions are enlarged by a micro-lens in a certain proportion, so that there is overlap between adjacent display images. The overlap of display images of a plurality of island-shaped display regions is used to eliminate or weaken the influence of splicing seams, and the resolution of a stretchable display substrate is improved, thereby optimizing the display effect.

The structure (or method) shown in this embodiment may be combined with structures (or methods) shown in other embodiments as appropriate.

At least one embodiment of the present disclosure further provides a method for preparing a display substrate, which includes preparing a flexible substrate body, wherein the flexible substrate body includes a plurality of island-shaped display regions spaced apart from each other, a hollow region disposed between adjacent island-shaped display regions and a connection region for connecting the adjacent island-shaped display regions; forming a thickness adjusting layer on the light exit side of the plurality of island-shaped display regions of the flexible substrate body; and forming a micro-lens layer on a side of the thickness adjusting layer away from the flexible substrate body. The orthographic projection of the thickness adjusting layer on the flexible substrate body includes the orthographic projection of the micro-lens layer on the flexible substrate body, and the orthographic projection of the micro-lens layer on the flexible substrate body at least partially overlaps the plurality of island-shaped display regions. The thickness adjusting layer and the micro-lens layer are configured to enlarge an image displayed by the plurality of island-shaped display regions.

In some exemplary embodiments, the preparation of a flexible substrate body includes: providing a flexible substrate; forming a display structure layer on the flexible substrate of the plurality of island-shaped display regions, the display structure layer includes a plurality of light-emitting units; forming a thin film encapsulation layer on a side of the display structure layer away from the flexible substrate; forming a color filter layer on the light exit side of the display structure layer of the island-shaped display region, wherein the color filter layer includes a black matrix and a plurality of filter units defined by the black matrix and correspond to the plurality of light-emitting units one to one; forming a hard mask layer on a side of the color filter layer away from the flexible substrate.

In some exemplary embodiments, the preparation method further includes sequentially forming a first adhesive layer and a first over coat layer on the side of the micro-lens layer away from the flexible substrate body; and sequentially forming a second adhesive layer and a second over coat layer on the side of the flexible substrate body away from the micro-lens layer.

The preparation method of this embodiment may refer to the descriptions in the above-mentioned embodiments, and thus will not be repeated herein.

Figure 19:
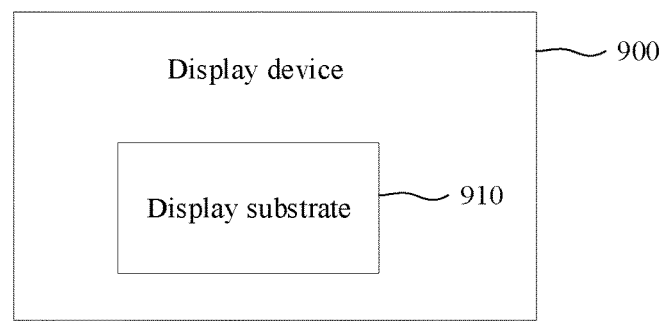
FIG. 19 is a schematic diagram of a display apparatus according to at least one embodiment of the present disclosure.

FIG. 19 is a schematic diagram of a display apparatus according to at least one embodiment of the present disclosure. As shown in FIG. 19, the embodiment provides a display apparatus 900, which includes a display substrate 910. The display substrate 910 is the display substrate provided in the above-mentioned embodiments. In some examples, the display substrate 910 may be an OLED display substrate. The display apparatus 900 may be any product or component with a display function, such as an OLED display apparatus, a cell phone, a tablet computer, a television, a display, a laptop computer, a digital photo frame, a navigator, a vehicle-mounted display, a watch, and a wristband. However, this embodiment is not limited thereto.

In the description of embodiments of the present disclosure, orientation or positional relationships indicated by terms "middle", "upper", "lower", "front", "back", "vertical", "horizontal", "top", "bottom", "inside", "outside" and the like are based on the orientation or positional relationships shown in the drawings, and are for the purpose of ease of description of the present disclosure and simplification of the description only, but are not intended to indicate or imply that the referred device or element must have a specific orientation, or be constructed and operated in a particular orientation, and therefore they should not be construed as limitations on the present disclosure.

Although the implementations disclosed in the present disclosure are as above, the described contents are only implementation adopted for convenience of understanding the present disclosure and are not intended to limit the present disclosure. Any skilled in the art to which the present disclosure belongs may make any modifications and changes in implementation forms and details without departing from the spirit and scope disclosed in the present disclosure. However, the scope of patent protection of the present disclosure is still subject to the scope defined by the appended claims.

The invention claimed is:

1. A display substrate, comprising:
   a flexible substrate body comprising: a plurality of island-shaped display regions spaced apart from each other, a hollow region disposed between adjacent island-shaped display regions and a connection region for connecting the adjacent island-shaped display regions;
   a thickness adjusting layer disposed on light exit sides of the plurality of island-shaped display regions of the flexible substrate body; and
   a micro-lens layer disposed on a side of the thickness adjusting layer away from the flexible substrate body, wherein an orthographic projection of the thickness adjusting layer on the flexible substrate body comprises an orthographic projection of the micro-lens layer on the flexible substrate body, and the orthographic projection of the micro-lens layer on the flexible substrate body is at least partially overlapped with the plurality of island-shaped display regions; the thickness adjusting layer and the micro-lens layer are configured to enlarge an image displayed by the plurality of island-shaped display regions,
   wherein at least one island-shaped display region comprises a flexible substrate, and
   wherein the display substrate further comprises a first adhesive layer and a first over coat layer sequentially disposed on a side of the micro-lens layer away from the flexible substrate body, and a second adhesive layer and a second over coat layer sequentially disposed on a side of the flexible substrate body away from the micro-lens layer.

2. The display substrate of claim 1, wherein the micro-lens layer comprises a plurality of micro-lenses; an orthographic projection of at least one of the plurality of micro-lenses on the flexible substrate body is at least partially overlapped with one of the plurality of island-shaped display regions; or, an orthographic projection of any one of the plurality of micro-lenses on the flexible substrate body is at least partially overlapped respectively with at least two adjacent island-shaped display regions of the plurality of island-shaped display regions.

3. The display substrate of claim 2, wherein the orthographic projection of any one of the plurality of micro-lenses on the flexible substrate body is at least partially overlapped with one of the plurality of island-shaped display regions, and orthographic projections of different micro-lenses on the flexible substrate body are at least partially overlapped with different island-shaped display regions respectively.

4. The display substrate of claim 3, wherein the orthographic projection of any one of the plurality of micro-lenses on the flexible substrate body is located within an island-shaped display region.

5. The display substrate of claim 2, wherein orthographic projections of at least two adjacent micro-lenses of the plurality of micro-lenses on the flexible substrate body are at least partially overlapped with a same island-shaped display region of the plurality of island-shaped display regions.

6. The display substrate of claim 2, wherein the thickness adjusting layer comprises a plurality of thickness adjusting regions corresponding to the plurality of micro-lenses one to one, and an orthographic projection of any one thickness adjusting region on the flexible substrate body comprises an orthographic projection of a corresponding micro-lens on the flexible substrate body;
   for any micro-lens of the micro-lens layer, a correlation between the micro-lens and a thickness of the corresponding thickness adjusting region is $1/f=1/h+1/L$, where f denotes a focal length of the micro-lens, h denotes a thickness of the thickness adjusting region, and L denotes a distance between human eyes and the display substrate.

7. The display substrate of claim 2, wherein types of the plurality of micro-lenses comprise at least one of a plano-convex lens and a lenticular lens.

8. The display substrate of claim 1, wherein the thickness adjusting layer is made of a stretchable material.

9. The display substrate of claim 1, wherein at least one island-shaped display region further comprises a display structure layer disposed on the flexible substrate, and a color filter layer disposed on a light exit side of the display structure layer;
   the display structure layer comprises a plurality of light-emitting units;
   the color filter layer comprises a black matrix and a plurality of filter units defined by the black matrix and corresponding to the plurality of light-emitting units one to one.

10. The display substrate of claim 9, wherein the display structure layer, the color filter layer, the thickness adjusting layer and the micro-lens layer are disposed on a same side of the flexible substrate; or, the display structure layer is disposed on a side of the flexible substrate, and the color filter layer, the thickness adjusting layer and the micro-lens layer are disposed on the other side of the flexible substrate.

11. The display substrate of claim 9, wherein the island-shaped display region further comprises:
   a thin film encapsulation layer disposed on a side of the display structure layer away from the flexible substrate; and
   a hard mask layer disposed on a side of the color filter layer away from the flexible substrate.

12. A display device, comprising the display substrate according to claim 1.

13. A display device, comprising the display substrate according to claim 2.

14. A display device, comprising the display substrate according to claim 3.

15. A display device, comprising the display substrate according to claim 4.

16. A display device, comprising the display substrate according to claim 5.

17. A method for preparing a display substrate, comprising:
- preparing a flexible substrate body, wherein the flexible substrate body comprises a plurality of island-shaped display regions spaced apart from each other, a hollow region disposed between adjacent island-shaped display regions and a connection region for connecting the adjacent island-shaped display regions;
- forming a thickness adjusting layer on a light exit side of the plurality of island-shaped display regions of the flexible substrate body; and
- forming a micro-lens layer on a side of the thickness adjusting layer away from the flexible substrate body;
- wherein, an orthographic projection of the thickness adjusting layer on the flexible substrate body comprises an orthographic projection of the micro-lens layer on the flexible substrate body, and the orthographic projection of the micro-lens layer on the flexible substrate body is at least partially overlapped with the plurality of island-shaped display regions; the thickness adjusting layer and the micro-lens layer are configured to enlarge an image displayed by the plurality of island-shaped display regions,
- wherein preparation the flexible substrate body comprises:
  - providing a flexible substrate;
- wherein the preparation method further comprises:
  - sequentially forming a first adhesive layer and a first over coat layer on a side of the micro-lens layer away from the flexible substrate body; and
  - sequentially forming a second adhesive layer and a second over coat layer on a side of the flexible substrate body away from the micro-lens layer.

18. The preparation method of claim 17, wherein preparation the flexible substrate body further comprises:
- forming a display structure layer on the flexible substrate of the plurality of island-shaped display regions, the display structure layer comprises a plurality of light-emitting units;
- forming a thin film encapsulation layer on a side of the display structure layer away from the flexible substrate;
- forming a color filter layer on a light exit side of the display structure layer of the island-shaped display region, wherein the color filter layer comprises a black matrix and a plurality of filter units defined by the black matrix and corresponding to the plurality of light-emitting units one to one; and
- forming a hard mask layer on a side of the color filter layer away from the flexible substrate.

* * * * *